United States Patent [19]
Ueda et al.

[11] Patent Number: 5,849,455
[45] Date of Patent: *Dec. 15, 1998

[54] PLASMA PROCESSING METHOD AND PLASMA PROCESSING APPARATUS

[75] Inventors: Shigenori Ueda; Junichiro Hashizume, both of Nara; Shinji Tsuchida, Tsuzuki-gun, all of Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 571,784

[22] Filed: Dec. 13, 1995

[30] Foreign Application Priority Data

Dec. 16, 1994 [JP] Japan .................................. 6-313391
Nov. 30, 1995 [JP] Japan .................................. 7-312345

[51] Int. Cl.$^6$ .............................. G03G 5/00; H05H 1/02; A01K 15/04; A61D 3/00
[52] U.S. Cl. ...................... 430/128; 427/574; 118/723 R
[58] Field of Search ............................ 430/128; 427/574; 118/723 R

[56] References Cited

U.S. PATENT DOCUMENTS

| 5,455,138 | 10/1995 | Okamura et al. | 430/128 |
| 5,534,070 | 7/1996 | Okamura et al. | 118/723 E |
| 5,540,781 | 7/1996 | Yamagami et al. | 118/723 E |
| 5,558,719 | 9/1996 | Tsuchida et al. | 118/723 E |

FOREIGN PATENT DOCUMENTS

| 0520519A1 | 12/1992 | European Pat. Off. | H01J 37/32 |
| 0562623A2 | 9/1993 | European Pat. Off. | H01L 21/205 |
| 0686708A1 | 12/1995 | European Pat. Off. | C23C 16/50 |
| 0697078 | 4/1994 | Japan | H01L 21/205 |
| WO 9419509 | 9/1994 | WIPO . | |

OTHER PUBLICATIONS

H. Goto, et al. "A Proposed Magnetically Enhanced Reactive Ion Etcher for ULSI", IEEE Transactions on Semiconductor Mfg., vol. 5, pp. 337–349 (1992).

M. Kubota, et al. "Lissajous Electron Plasma Technology for Quarter Micrometer by Dry Etch Process" 10466 Extended Abstracts, May 16–21 (1993) (p. 350) XP000430468.

H. Curtins et al., "Influence of Plasma Excitation Frequency for a–Si:H Film Deposition", *Plasma Chemistry and Plasma Processing*, 7, 3, 267–73 (1987).

*Primary Examiner*—Mark Chapman
*Attorney, Agent, or Firm*—Fitzpatrick, Cella, Harper & Scinto

[57] ABSTRACT

A plasma processing method and a plasma processing apparatus are provided in which a deposition film is formed, on a substrate serving also as an electrode, by application of high frequency power ranging from 20 MHz to 450 MHz with simultaneous application of DC voltage ranging from 30 to 300 V or –30 to –300 V and/or AC voltage ranging from 30 to 600 V to the substrate in an evacuatable reaction chamber. This method make it practicable to uniformize the plasma and the film thickness distribution independently of the discharge frequency and the applied high frequency power, thereby broadening the allowable range of conditions of the processing such as film formation and the allowable range of the design of the apparatus.

46 Claims, 9 Drawing Sheets

PLASMA PROCESSING METHOD AND PLASMA PROCESSING APPARATUS

BACKGROUND OF THE INVENTION

1. Field of the Invention

The present invention relates to a plasma processing method for formation of a deposition film or the like, and to a plasma processing apparatus for formation of a deposition film or the like. More particularly, the present invention relates to a plasma processing method which is applicable for forming a deposition film on a substrate by plasma discharge as an excitation energy source like a plasma CVD, and capable of forming an electrophotographic photosensitive member comprising a non-monocrystalline material comprising silicon atoms as a matrix by application of high frequency of from 20 MHz to 450 MHz, and also relates to an apparatus therefor.

2. Related Background Art

Hitherto, non-monocrystalline deposition films have been reported as an element of an electrophotographic photosensitive member. An example thereof is an amorphous deposition film like an amorphous silicon deposition film in which dangling bonds are compensated by hydrogen or halogen (e.g., fluorine, and chlorine). Some of the non-monocrystalline deposition films are practically used.

Various methods are known for formation of such deposition films, including sputtering, decomposition of a source gas by heating (thermal CVD), decomposition of a source gas by light irradiation (photo-assisted CVD), and decomposition of a source gas by plasma (plasma CVD). Of these methods, the plasma CVD decomposes a source gas by glow discharge caused by DC or high frequency (RF wave, VHF wave, micro-wave, etc.) to form a thin deposition film on a substrate such as glass, quartz, heat-resistant synthetic resins, stainless steel, and aluminum. This plasma CVD method has been improved remarkably in forming a deposition film of amorphous silicon (a-Si) for electrophotography and other application fields. Various apparatuses have also been proposed therefor.

In recent years, film quality and processing capacity such as performance, quality and the like are required to be further improved, and various investigations have been made for the improvements.

In particular, plasma processes employing high frequency power are widely used because of advantages such as high stability of the discharge, applicability to formation of insulation material like oxide films and nitride films, and so forth.

The oscillation frequency of high frequency discharge power source is conventionally 13.56 MHz for the plasma process including the plasma CVD process. In film formation by the plasma process, the deposition is conducted, for example, at a deposition rate of about 6 $\mu$m per hour to obtain an a-Si film having satisfactory properties for an electrophotographic photosensitive member. At a deposition rate higher than that, the desired properties for the electrophotographic photosensitive member cannot always be achieved.

Generally, an a-Si film for electrophotographic photosensitive member is required to have a thickness of at least 20–30 $\mu$m in order to achieve sufficient chargeability. At the aforementioned deposition rate, an extremely long time is necessary to form an electrophotographic photosensitive member of the required thickness.

A plasma CVD system has been disclosed which employs a parallel plate plasma CVD system with a high frequency power source of 20 MHz or higher (Plasma Chemistry and Plasma Processing, Vol.7, No.3, pp.267–273 (1987)), and the possibility was shown that a frequency higher than the conventional 13.56 MHz improves the deposition rate without affecting the properties of the deposition film. The advantages of the higher discharge frequency have been also reported during sputtering, and are widely investigated.

Japanese Laid-Open Patent Application No. 6-97078 discloses a CVD technique which employs a high frequency power source of 30 MHz or higher and applies a negative voltage to a substrate to obtain a thin amorphous silicon film of high quality. The disclosed method forms a film with a uniform thickness distribution on a large-area substrate by controlling the distance between the electrodes. However, this Laid-Open Patent Application does not mention the problems such as spherical protrusions caused by abnormal growth of deposition film which are inherent to the processes and apparatuses for production of an electrophotographic photosensitive member, and discloses nothing about application of a positive DC voltage or an AC voltage to the substrate.

FIG. 1 shows an example of a plasma CVD apparatus employing high frequency discharge power ranging from 20 MHz to 450 MHz. This plasma CVD apparatus is a film-forming apparatus for forming an a-Si film on a cylindrical substrate for an electrophotographic photosensitive member. A procedure of formation of an a-Si film by VHF-PCVD with this apparatus is explained below.

This apparatus is constituted basically of a deposition system 1100, a source gas-feeding system 1200, and an evacuation system (not shown in the drawing) for evacuating the internal space of a reaction chamber 1111. The cylindrical substrate 1112 is placed on a grounded pedestal 1124 in the reaction chamber 1111 of the deposition system 1100. A substrate heater 1113 is placed inside the cylindrical substrate. Source gas-introducing pipes 1114 are placed in the reaction chamber. A VHF power source 1120 is connected through a high-frequency matching box 1115 to the reaction chamber.

The source gas-feeding system 1200 has gas cylinders 1221–1226 of source gases of $SiH_4$, $H_2$, $CH_4$, NO, $B_2H_6$, $SiF_4$, and the like, valves 1231–1236, 1241–1246, and 1251–1256, and mass flow controllers 1211–1216. The respective source gas cylinders are connected through a main valve 1260 to the gas-introducing pipes 1114 in the reaction chamber 1111.

An example of the procedure for formation of an electrophotographic photosensitive member is described below by using the apparatus shown in FIG. 1.

A cylindrical substrate 1112 connected to the ground is placed in a reaction chamber 1111, and the internal space of the reaction chamber 1111 is evacuated by an evacuation system (e.g., a vacuum pump) not shown in the drawing. Then the substrate 1112 is heated by a substrate heater 1113, and is kept at a prescribed temperature ranging from 20° C. to 500° C.

In order to introduce the source gases for a deposition film formation into the reaction chamber 1111, the valves 1231–1236 of gas cylinders 1221–1226, and a leak valve 1117 of the reaction chamber 1111 are closed; inlet valves 1241–1246, outlet valves 1251–1256, and an auxiliary valve 1260 are opened; and then a main valve 1118 is opened and the inside of the reaction chamber 1111 and gas pipes 1116 are evacuated.

When the reading of a manometer 1119 has reached about $5\times10^{-6}$ Torr, the auxiliary valve 1260 and the outlet valves 1251–1256 are closed.

Then, gas cylinder valves 1231–1236 are opened to feed the respective source gases from gas cylinders 1221–1226. The pressures of the respective source gases are controlled to be 2 kg/cm$^2$ by pressure controllers 1261–1266. The inlet valves 1241–1246 are opened gradually to introduce respectively the gases to mass controllers 1211–1216.

After the apparatus is readied for film formation as described above, a photoconductive layer is formed on the substrate 1112 as below. When the substrate 1112 has reached the prescribed temperature, necessary outlet valves 1251–1256 and the auxiliary valve 1260 are opened gradually to feed necessary gases from the gas cylinders 1221–1226 through the gas-introducing pipes 1114 into the reaction chamber 1111. The flow rates of the respective source gases are controlled to be at prescribed rates by the mass controllers 1211–1216. Simultaneously, the opening of the main valve 1118 is adjusted to keep the internal pressure of the reaction chamber 1111 at a pressure not higher than 1 Torr by monitoring a manometer 1119. After the internal pressure has become steady, a VHF power source 1120 is set at a prescribed power level, and a VHF power at a frequency ranging from 20 to 450 MHz is supplied through a high frequency matching box 1115 to the reaction chamber 1111 to cause glow discharge toward a grounded pedestal 1124 and the electroconductive substrate 1112. The source gases introduced into the reaction chamber 1111 are decomposed by discharge energy to form a desired photoconductive layer on the substrate 1112. When the layer has grown to a desired thickness, the VHF power supply is stopped, and the outlet valves are closed to stop the gas introduction to the reaction chamber and to finish the formation of the photoconductive layer.

Further formation of a surface layer on the above photoconductive layer, or another layer on the substrate 1112 can be conducted in a similar manner as the above operation in principle.

During the film formation, the cylindrical substrate 1112 may be rotated at a predetermined rate by a driving device such as a motor (not shown in the drawing) to form uniformly the film in its entirety.

Investigations have been made to employ higher frequency power in place of conventional high frequency of 13.56 MHz to improve the properties and the deposition rate of the deposition films by use of a plasma CVD apparatus as explained above. Consequently, it was confirmed that the higher frequency enables formation of a deposition film with excellent properties of the film at a higher deposition rate.

However, another problem arose which is not encountered at the discharge frequency of 13.56 MHz. The problem is such that, when the higher frequency power is used at a lower power level in the discharge frequency range higher than 20 MHz, especially higher than 31 MHz, or higher than 50 MHz, the plasma is distributed nonuniformly, and consequently a film is formed at a nonuniform deposition rate over a relatively large-area substrate like an electrophotographic photosensitive member to give a film having nonuniform thickness. The nonuniform film thickness results in nonuniformity of the properties of the formed electrophotographic photosensitive member, which can be a great disadvantage in practical use.

For example, film formation conditions of an amorphous silicon (a-Si) photosensitive member are decided in consideration of balances of image defects, film properties, and so forth. The image defects tend to be more serious at a higher application voltage of the high frequency power, and less serious at a lower application voltage.

The image defects as mentioned here means circular blank spots, called white dots, on a solid black image.

One of the causes of such image defects is considered to be foreign matters of a size of several to several tens of microns existing on the surface of the substrate or of a depositing film, the foreign matters functioning as nuclei for growth of the film to cause abnormal growth (formation of spherical protrusions) in a column shape or an inverted cone shape toward the deposition film surface.

The spherical protrusions and the white dots are presumed to be developed by the mechanism as below. Foreign matters such as burrs, scratches, chips, and dusts, if present on the surface of the substrate or the depositing film, will change the potential of the plasma locally at the sites of the foreign matters, which can change active species formed in, or transported to the surrounding plasma space, or can prevent movement of the active species on the surface, thereby changing the surface reaction for film deposition. As a result, the portions of the deposition film formed on and around the foreign matter nuclei have properties different from the normal portions, and have unsatisfactory film properties electrophotographically, in particular, a low dark resistance.

In practical use of an electrophotographic deposition film in an electrophotographic apparatus, the surface of the electrophotographic deposition film is charged uniformly electrically by corona discharge with a primary corona assembly, and a toner image is formed by coulomb force of the resulting surface charge. If the aforementioned spherical protrusion exists, the surface charge given to the protrusion site is removed quickly through the aforementioned lower dark resistance portion, where the toner is not attracted. Therefore, white image defects appear in white spots (white dots) in a solid black image in correspondence with the sites of the spherical protrusions to impair image quality. Further, the spherical protrusions existing on the surface of the electrophotographic photosensitive member (1) accelerate deterioration of the properties of the cleaning blade which slides over the surface of the photosensitive member to recover any remaining toner, or (2) damage the cleaning blade during repeated copying, thereby causing defective cleaning.

This undesired phenomenon caused by the spherical protrusions is more serious at a higher power level of the high frequency power. At a lower power level, the spherical protrusions grow less, possibly even in the presence of foreign matters on the substrate, since the deposition film grows by covering the foreign matters. Even if the spherical protrusions grow, the properties are not distinct between the spherical protrusion portions and the normal film at a lower power level, so that image defects are less liable to be caused. Further, at a lower power level, the formed protrusions are low in height above the deposition film surface, whereby the cleaning blade is less liable to be damaged or deteriorated. However, at the lower power level, the formed film is not sufficiently uniform as mentioned above, which defect is required to be improved.

The above discussion is concerned with image defects. However, the film formed at a higher power level does not necessarily have appropriate properties. Since the film forming conditions are decided in consideration of balancing the image defects, the film properties, and the film formation rate, the electrophotographic photosensitive member-producing apparatus is required to be adaptable to a broad range of production conditions.

SUMMARY OF THE INVENTION

An object of the present invention is to provide a plasma processing method which is useful for deposition film formation and is capable of processing by plasma a substrate of relatively large area uniformly at a low power level of high frequency power without the aforementioned disadvantages, which is not achievable by a conventional plasma process, and is also to provide a plasma processing apparatus useful for deposition film formation.

Another object of the present invention is to provide a deposition film-forming method for an electrophotographic photosensitive member which causes less image defects even at film-forming conditions of a high power level of high frequency power and is capable of reducing damage or deterioration of the cleaning blade and improving the durability of the cleaning blade, and also to provide a deposition film-forming apparatus for conducting the above method.

A further object of the present invention is to provide a plasma processing method which is applicable in a broad range of the discharge power with wide latitude of film formation conditions without causing nonuniformity of the film properties such as nonuniform film thickness and without electrophotographic image defects, and also to provide a plasma processing apparatus for the above method.

A still further object of the present invention is to provide a plasma processing method which causes no localization of discharge and is capable of processing with sufficiently small loss of applied discharge power at improved utilization efficiency of the source gases and improved deposition rate.

The plasma processing method of the present invention employs a substrate to be processed and serving as a first electrode, and a second electrode opposing to the first electrode provided in a chamber connected to an evacuation means and a source gas-feeding means, and applies high frequency power in a frequency range of from 20 to 450 MHz to generate plasma discharge between the first electrode and the second electrode, thereby decomposing a source gas introduced into the chamber to subject the substrate to plasma processing, wherein a DC voltage and/or an AC voltage is applied to the first electrode.

The plasma processing apparatus of the present invention comprises a chamber connected to an evacuation means and a source gas-feeding means, and a high frequency power source for applying high frequency power in a frequency range of from 20 to 450 MHz between a substrate serving as a first electrode to be processed and a second electrode opposing to the first electrode provided in the chamber, wherein a second power source is provided for applying a DC voltage and/or an AC voltage to the first electrode.

DESCRIPTION OF THE PREFERRED EMBODIMENTS

Figure 1:
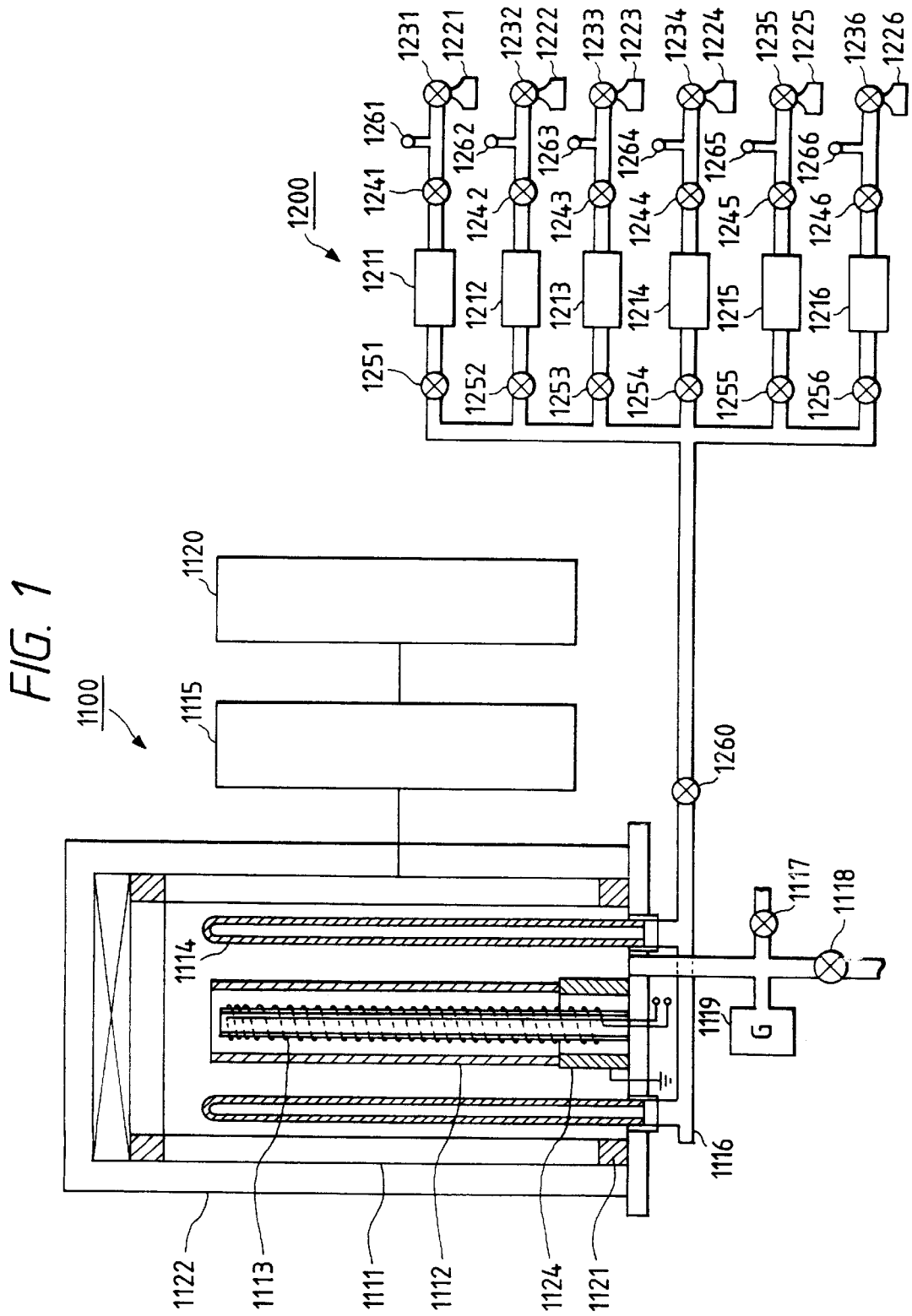
FIG. 1 is a schematic drawing for explaining an example of a film-forming apparatus to which a VHF-plasma chemical vapor deposition method (VHF-PCVD method) is applicable.

Film formation by use of a conventional CVD apparatus was investigated in a discharge frequency range of from 20 to 450 MHz by the inventors of the present invention. In the investigation, the problem of instability and non-uniformity of the discharge, namely localization of plasma arose, which was not encountered at the conventionally employed discharge frequency of 13.56 MHz as described before.

The cause is presumed by the inventors of the present invention as below.

When a substrate to be processed is placed on a grounded pedestal (holder), the surface potential of the substrate varies with the distance from the pedestal (in the axis direction for a cylindrical substrate), with the discharge being localized at the lower portion of the substrate near the ground and the upper portion of the substrate distant from the ground. This phenomenon is remarkable at lower VHF power levels. Therefore, it is presumed that, at high power levels, the plasma density is higher and gives uniform discharge independently of the grounding conditions.

However, at a higher power level, although uniform discharge is obtained as described above, the presence of a foreign matter such as burrs, scratches, chips, and dusts on a surface of a substrate to be processed or of a growing deposition film causes local concentration of the electric field. The greater concentration of the electric field at high power levels could change active species formed in the surrounding plasma space or transported thereto, or could prevent movement of the active species on the surface, to change the surface reaction for deposition film formation. As a result, the portions of the deposition film formed on the foreign matter nuclei have properties different from the normal portions, and are unsatisfactory for electrophotography, in particular having a low dark resistance.

The growth rate of the deposition film is higher at a higher power level. Therefore, with the same number of foreign matters existing on the substrate to be processed, the electrophotographic photosensitive member produced at a higher power level has a larger number of defects and tends cause more image defects.

To offset the above disadvantage, investigation was made to apply sufficient power throughout the discharge space by application of DC and/or AC voltage to maintain the surface potential uniform in the axis direction of the substrate.

As a result, it was found that the localized distribution of the plasma discharge which occurs at a discharge frequency of higher than 20 MHz, particularly higher than 31 MHz, more particularly than 50 MHz is prevented by application of DC voltage of from 30 to 300 V or from −30 to −300 V, and/or AC voltage of from 30 to 600 V to the substrate to uniformize the surface potential in the axis direction of the substrate to prevent the uneven distribution of discharge. It was also found that, at a further higher power level, such application of voltage prevents the localization of the electric field onto the foreign matters such as burrs, scratches, chips, and dusts to prevent the uneven distribution of the plasma. This is effective to decrease image defects, and is effective practically for the electrophotographic photosensitive member. This effect is particularly remarkable when positive DC voltage and/or AC voltage is applied.

It is presumed by analogy that the application of DC voltage and/or AC voltage to the substrate in the deposition method of the present invention can also be effective similarly at a frequency higher than 450 MHz in plasma CVD in preventing growth of spherical or like protrusions on a discharge counter electrode.

The AC voltage is not limited to sine wave voltage, but may be rectangular wave voltage. The rectangular voltage includes a DC voltage component depending on the duty ratio, which enables effective power supply advantageously. The shape of the substrate is not limited to be cylindrical, but may be trigonal, tetragonal, or hexagonal in cross-section, or even planar for formation of uniform film by application of DC and/or AC voltage in superposition onto the high frequency power.

The reaction chamber is preferably a vacuum-tight vessel, but may be any vessel which is capable of producing a vacuum necessary for formation of a photosensitive member or other objects.

The present invention is described specifically below by reference to the drawings.

Figure 2:
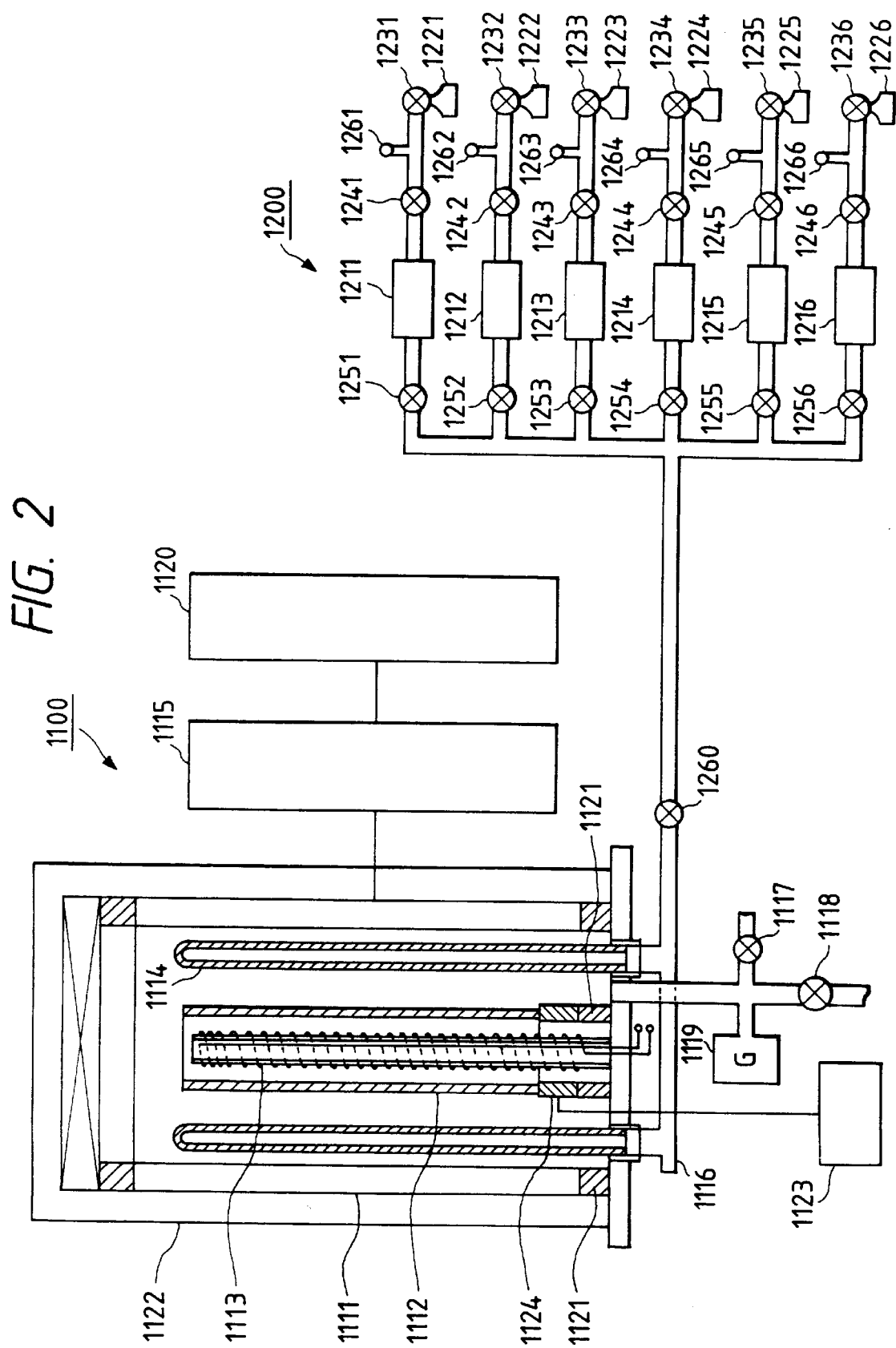
FIG. 2, FIG. 3, and FIG. 6 are respectively a schematic drawing for explaining an example of a film-forming apparatus to which the VHF-PCVD method of the present invention is applicable.

FIG. 2 is a schematic diagram showing an example of a deposition film-forming apparatus of the present invention according to VHF-plasma CVD.

This apparatus is constituted basically of a deposition system 1100, a gas-feeding system 1200 for feeding source gases and the like, and an evacuation system (not shown in the drawing) for evacuating the internal space of a reaction chamber 1111. A substrate 1112 can be placed in the reaction chamber 1111 of the deposition system 1100. The substrate 1112 is connected electrically to a power source 1123 for application of DC voltage and/or AC voltage. The reaction chamber itself serves as a second electrode of the deposition system. A substrate heater 1113, source gas-introducing pipes 1114 are placed in the reaction chamber. A VHF power source 1120 is connected through a high-frequency matching box 1115 to the reaction chamber.

The source gas-feeding system 1200 has gas cylinders 1221–1226 for the source gases (including diluting or doping gases) of $SiH_4$, $H_2$, $CH_4$, $NO$, $B_2H_6$, $SiF_4$, and the like, valves 1231–1236, 1241–1246, and 1251–1256, and mass flow controllers 1211–1216. The source gas cylinders are connected through a valve 1260 to the gas-introducing pipes 1114 in the reaction chamber 1111.

The voltage applied to the substrate onto which a film is formed and which serves a first electrode in the present invention is DC voltage, AC voltage, or AC-DC superposition voltage.

Any DC power source is useful which is capable of applying voltage of at least −30 V or more negative, or +30 V or more positive to the first electrode. The DC voltage may be constant voltage without variation with time, or may be voltage varying with time such as half-wave rectified voltage.

Any AC voltage source is useful which is capable of applying voltage varying at least in a range of from 0 to 1 KV to the first electrode. The AC voltage may be sine-wave voltage, rectangular voltage, triangular voltage, or composite voltage thereof.

When the applied voltage varies periodically with time, the frequency of the voltage is preferably not more than about 2 MHz which is the upper limit voltage for the ions in the plasma to follow the variation of the sheath field in the sheath region formed on the substrate.

The DC and/or AC voltage is applied to the substrate as described below. Firstly the substrate 1112 to be processed is insulated electrically. The insulation may be conducted by any method which inhibits grounding of the substrate to be processed. For example, as shown in FIG. 2, an electroconductive pedestal 1124 which is connected to a power source 1123 is placed on an insulation material 1121, and the substrate 1112 to be processed is placed on the pedestal. The DC and/or AC voltage can be applied to the substrate 1112 from the power source 1123 through the electroconductive pedestal to the substrate insulated from the reaction chamber 1111.

The DC and/or AC voltage may be applied directly to any part of the substrate, or applied through an electroconductive material as shown in FIG. 2. The DC and/or AC voltage level may be kept constant throughout the deposition film formation, or may be varied during the deposition film formation or for each of multiple layers in multiple deposition layer formation.

The electroconductive material useful in the present invention includes copper, aluminum, gold, silver, platinum, lead, nickel, cobalt, iron, chromium, molybdenum, titanium, stainless steel, and composites of two or more thereof.

The insulating material for insulating the substrate includes ceramics, Teflon band poly(tetrafluoroethylene) mica, glass, quartz, silicone rubber, polyethylene, polypropylene, and the like.

The VHF source 1120 for the high frequency power in the present invention may be any power source which is capable of generating a power of oscillation frequency of not lower than 20 MHz, preferably not lower than 31 MHz, more preferably not lower than 50 MHz, and not higher than 450 MHz, and an output power of from 10 W to 5000 W or higher suitable for the apparatus.

The output variation coefficient of the high frequency power is not specially limited.

The voltage applied to the substrate to be processed is DC voltage ranging from +30 to +300 V or from −30 to −300 V and/or AC voltage ranging from 30 to 600 V for obtaining uniform and steady discharge at a desired VHF power level, and the power level is preferably in a VHF power region ranging from 50 W to 1 KW in view of the quality and electrophotographic properties of the resulting deposition film.

Figure 3:
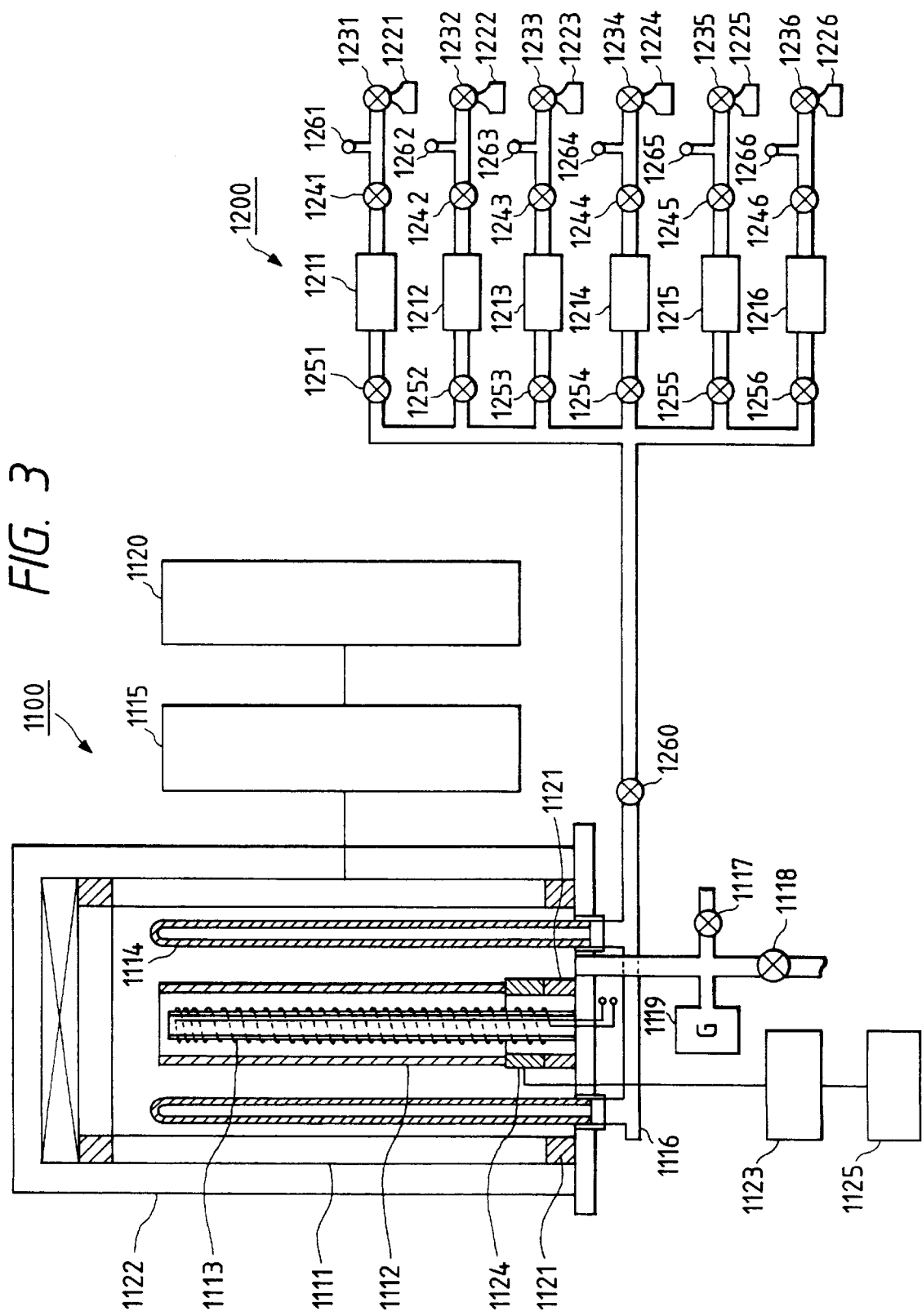

FIG. 3 is a schematic drawing for explaining another example of a deposition film-forming apparatus of the present invention for forming a deposition film according to VHF plasma CVD.

This apparatus is constituted basically of a deposition system 1100, a gas-feeding system 1200 for feeding source gases, and an evacuation system (not shown in the drawing) for evacuating the internal space of a reaction chamber 1111. A substrate 1112 which serves as a first electrode is placed in the reaction chamber 1111 as a second electrode of the deposition system 1100, and is constructed such that DC voltage and AC voltage are simultaneously applicable thereto. The substrate 1112 is electrically connected through an electroconductive pedestal 1124 to a DC power source 1123 and an AC power source 1125, and is insulated electrically from the reaction chamber 1111 via an insulating material 1121. Further, a substrate heater 1113, source gas-introducing pipes 1114 are placed in the reaction chamber. A VHF power source 1120 is connected through a high-frequency matching box 1115 to the reaction chamber.

Figure 4:
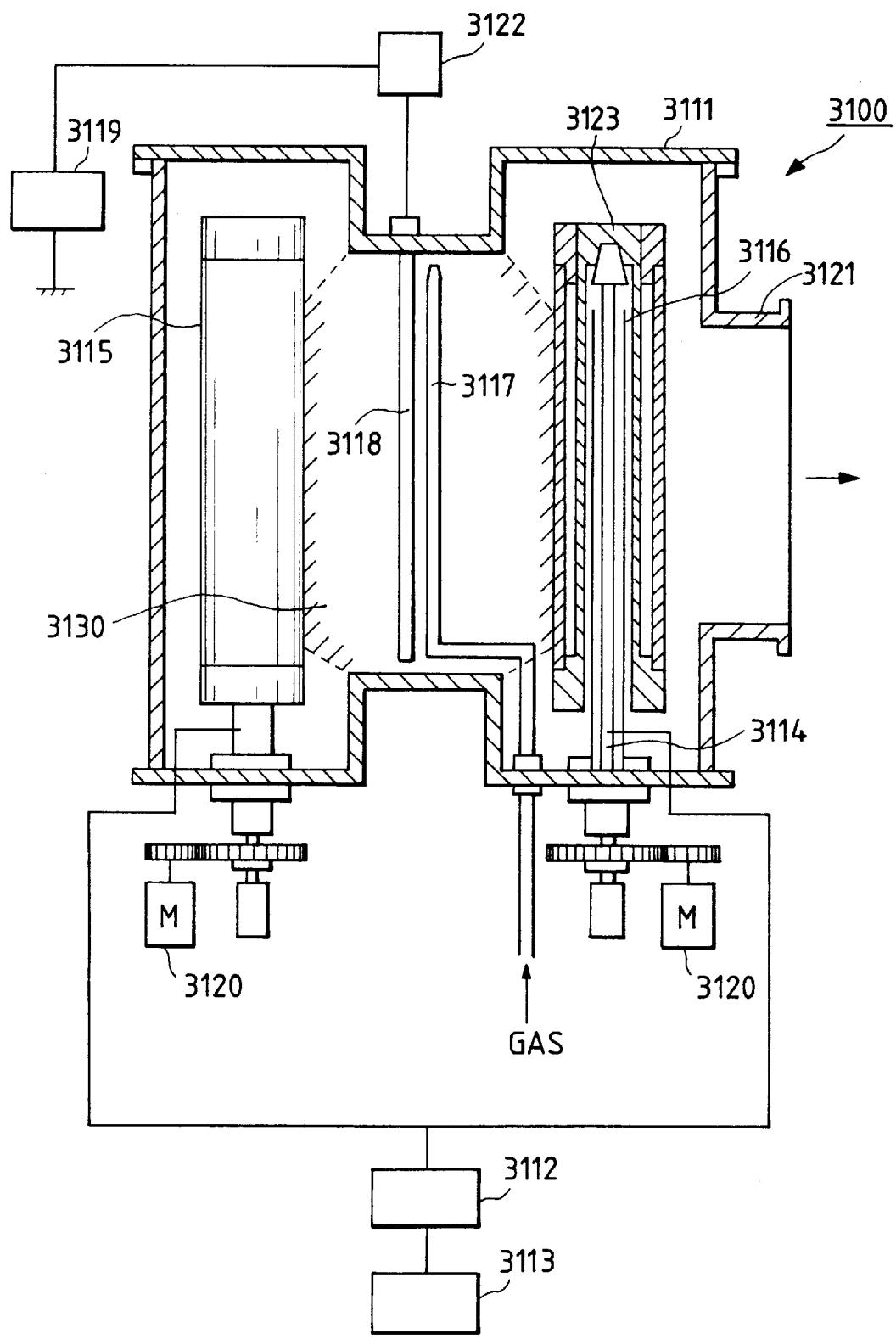
FIG. 4, and FIG. 5 are respectively a schematic drawing for explaining the structure of the film-forming chamber and its periphery of the film-forming apparatus to which the VHF-PCVD method of the present invention is applicable.
Figure 5:
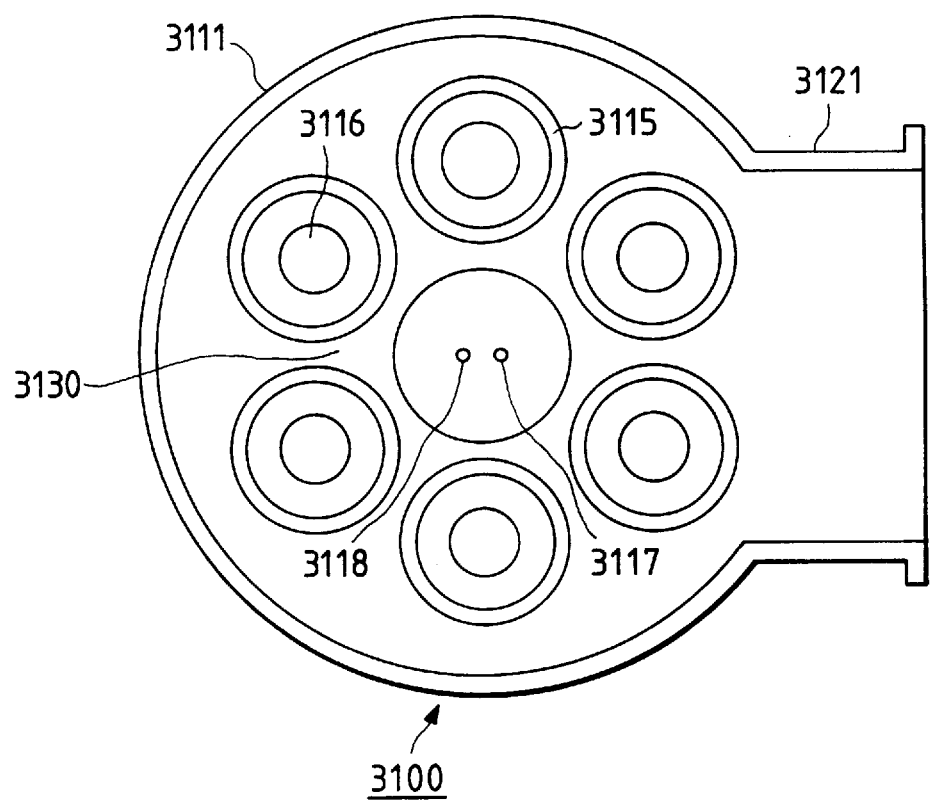
Figure 6:
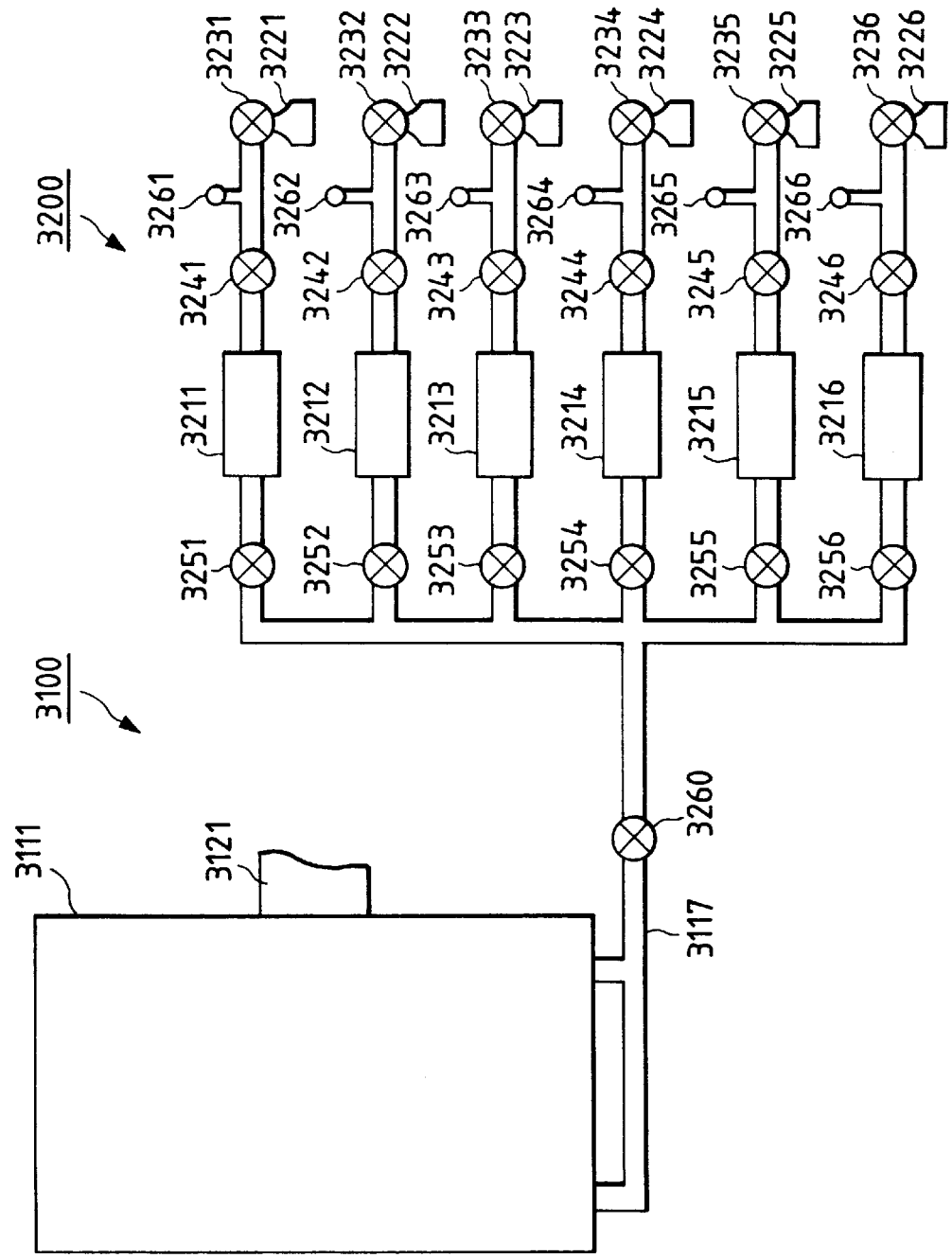

FIG. 4, FIG. 5, and FIG. 6 are schematic drawings for explaining still another example of the deposition film-forming apparatus of the present invention for forming a deposition film according to VHF plasma CVD. FIG. 6 shows schematically the entire constitution of the apparatus. FIG. 4 is a schematic vertical sectional view of the reaction chamber. FIG. 5 is a schematic horizontal sectional view of the reaction chamber.

In FIGS. 4, 5, and 6, a reaction chamber 3111 has a structure capable of being evacuated. An evacuation tube 3121 is opened at the one end to the interior of the reaction chamber 3111 and at the other end to an evacuation system (not shown in the drawings). The numeral 3130 indicates a discharging space surrounded by substrates 3115 serving as first electrodes. A VHF power source 3119 is a high frequency power source for applying VHF power to a second electrode 3118, and is connected electrically through a high frequency matching box 3122 to the second electrode 3118.

The substrates 3115 are set on a holders 3123 which are engaged with rotation axes 3114. The portion of the rotation axes 3114 contacting with the reaction chamber 3111, and the gears 3124 of the rotation axes are made from an insulating material to insulate electrically the substrates 3115 and the holders 3123. A DC power source 3112 and an AC power source 3113 are connected electrically to the rotation axes 3114, thereby DC voltage and/or AC voltage can be is applied through the rotation axes 3114 and the holders 3123 to the substrates 3115.

In the explanation of the present invention, the rotation axes 3114 and the holders 3123 are made from an electroconductive material. However, they may be made from an insulating material by selecting the method of DC and/or AC application suitably.

The electroconductive material useful in the present invention includes copper, aluminum, gold, silver, platinum, lead, nickel, cobalt, iron, chromium, molybdenum, titanium, stainless steel, and composites and alloys of two or more thereof.

The insulating material for insulating the substrate to be processed includes organic and inorganic materials such as ceramics, Teflon band poly(tetrafluoroethylene), mica, glass, quartz silicone rubber, polyethylene, polypropylene, and the like.

The method of insulation of the substrate, and the method of DC and/or AC voltage application are not limited, provided that the DC and/or AC voltage can be applied to the insulated substrate.

The construction of the high frequency matching box 3122 employed is not limited specially, provided that it is capable of matching the power source with the load. The matching is preferably controlled automatically, but may be controlled manually. The material for the electrode 3118 for VHF power application includes copper, aluminum, gold, silver, platinum, lead, nickel, cobalt, iron, chromium, molybdenum, titanium, stainless steel, and composites and alloys of two or more thereof. The shape of the electrode 3118 is preferably cylindrical, but may be in a shape of an ellipsoidal column or a polygonal column. The electrode 3118 may be provided with a cooling means if necessary. The cooling is conducted by utilizing water, air, liquid nitrogen, or a Peltier element.

In the drawings, the rotation axes 3114 with the substrates 3115, or the holders 3123 with the substrates 3115 serve as counter electrodes opposing to the electrode 3118, and are made of a suitable material and have a suitable shape for the object. For example, the shape is preferably cylindrical for production of an electrophotographic photosensitive member, but may be planar or in another shape as desired. The material therefor includes copper, aluminum, gold, silver, platinum, lead, nickel, cobalt, iron, chromium, molybdenum, titanium, stainless steel, and composites and alloys of two or more thereof, and insulating materials coated with an electroconductive material, the insulating material including polyester, polyethylene, polycarbonate, cellulose acetate, polypropylene, polyvinyl chloride, polyvinylidene chloride, polystyrene, glass, ceramics, and paper.

An example of procedures of formation of a photoconductive layer of an electrophotographic photosensitive member is described by use of an apparatus shown in FIG. 2.

A cylindrical substrate 1112 is placed in a reaction chamber 1111, and the internal space of the reaction chamber 1111 is evacuated by an evacuation system (e.g., a vacuum pump) not shown in the drawing. Then the substrate 1112 is heated by a pedestal heater 1113, and is kept at a prescribed temperature ranging, e.g., from 20° to 500° C.

Source gases for deposition film formation are introduced into the reaction chamber 1111 through the steps below. Valves 1231–1236 of gas cylinders 1221–1226, a leak valve 1117 of the reaction chamber 1111 are checked to be closed; inlet valves 1241–1246, outlet valves 1251–1256, and an auxiliary valve 1260 are opened; and then a main valve 1118 is opened to evacuate the inside of the reaction chamber 1111 and gas pipings 1116. When the reading of a manometer 1119 has reached, e.g., about $5 \times 10^{-6}$ Torr, the auxiliary valve 1260 and the outlet valves 1251–1256 are closed.

Then, gas cylinder valves 1231–1236 are opened to feed the respective source gases from gas cylinders 1221–1226. The pressures of the respective source gases are controlled, for example, to be 2 $kg/cm^2$ by pressure controllers 1261–1266. The inlet valves 1241–1246 are opened gradually to introduce the respective gases to mass controllers 1211–1216.

After the apparatus is readied for film formation as described above, a photoconductive layer is formed on the substrate 1112 as below. When the substrate 1112 has reached to the prescribed temperature, necessary ones of the outlet valves 1251–1256 and the auxiliary valve 1260 are opened gradually to feed necessary gases from the gas cylinders 1221–1226 through the gas-introducing pipes 1114 into the reaction chamber 1111. The flow rates of the respective source gases are controlled to be at prescribed levels by the mass controllers 1211–1216. Simultaneously, the opening of the main valve 1118 is adjusted to keep the internal pressure of the reaction chamber 1111 not higher than, e.g., 1 Torr by monitoring a manometer 1119. When the internal pressure has become steady, a predetermined bias is applied to the substrate 1112 by setting a power source 1123 at a prescribed power level, and simultaneously a VHF power at a desired frequency ranging from 20 to 450 MHz is applied through a high frequency matching box 1115 to the reaction chamber to cause glow discharge between the reaction chamber 1111 and the substrate 1112. The source gases introduced into the reaction chamber 1111 are decomposed by discharge energy to form a photoconductive layer on the substrate 1112. When the layer has been formed in a desired thickness, the VHF power supply is stopped, and the outlet valves are closed to stop the gas introduction to the reaction chamber and to finish the formation of the photoconductive layer.

In the case where a surface layer, a charge injection-inhibiting layer, or another layer is formed for the electrophotographic photosensitive member, or where a layer for uses other than an electrophotographic photosensitive member is formed, the similar operations are conducted in principle.

During the film formation, the substrate 1112 may be rotated at a prescribed rate by a driving mechanism not shown in the drawing.

Still another example of procedures of formation of an electrophotographic photosensitive member is described by use of a deposition film-forming apparatus shown in FIGS. 4, 5, and 6.

The source gas-feeding system 3200 comprises gas cylinders 3221–3226 of the source gases of $SiH_4$, $H_2$, $CH_4$, NO, $B_2H_6$, $SiF_4$, and the like, valves 3231–3236, 3241–3246, and 3251–3256, and mass flow controllers 3211–3216. The source gas cylinders are connected through a valve 3260 to the gas-introducing pipes 3117 in the reaction chamber 3111.

A cylindrical substrates 3115 are placed in a reaction chamber 3111, and the internal space of the reaction chamber 3111 is evacuated by an evacuation system (e.g., a vacuum pump) not shown in the drawing. Then the substrates 3115 are heated by a substrate heater 3116, and are kept at a prescribed temperature ranging from 20° to 500° C.

Source gases for deposition film formation are introduced into the reaction chamber 3111 through the steps below. Valves 3231–3236 of gas cylinders 3221–3226 are checked to be closed; inlet valves 3241–3246, outlet valves 3251–3256, and an auxiliary valve 3260 are opened; and then the internal space of the reaction chamber 3111 and gas pipings 3116 are evacuated. When the reading of a manometer (not shown in the drawings) has reached, e.g., about $5 \times 10^{-6}$ Torr, the auxiliary valve 3260 and the outlet valves 3251–3256 are closed.

Then, gas cylinder valves 3231–3236 are opened to feed the respective source gases from gas cylinders 3221–3226. The pressures of the respective source gases are controlled, for example, to be 2 $kg/cm^2$ by pressure controllers 3261–3266. The inlet valves 3241–3246 are opened gradually to introduce the respective gases to mass controllers 3211–3216.

After the apparatus is readied for film formation as described above, a photoconductive layer is formed on the substrate 3115 as below. When the substrates 3115 have reached to the prescribed temperature, necessary ones of the outlet valves 3251–3256 and the auxiliary valve 3260 are opened gradually to feed necessary gases from the gas cylinders 3221–3226 through the gas-introducing pipes 3117 into the reaction chamber 3111. The flow rates of the respective source gases are controlled to be at prescribed levels by the mass controllers 3211–3216. Simultaneously, the opening of the variable-type evacuation resistance (not shown in the drawings) is adjusted to keep the internal pressure of the reaction chamber 3111, e.g., not higher than 1 Torr by monitoring a manometer (not shown in the drawings). When the internal pressure has become steady, a DC power source 3112 and/or an AC power source 3113 is set at a prescribed level, and a desired DC voltage and/or AC voltage is applied to the substrates 3115. Simultaneously a VHF power source 3119 is set at a desired level, and VHF power of frequency ranging from 20 to 450 MHz is applied through a high frequency matching box 3122 to the reaction chamber 3111 to cause glow discharge between the substrates 3115. The source gases introduced into the reaction chamber 3111 are decomposed by the discharge energy to form a photoconductive layer on the substrate 3115. When the layer has been formed in a desired thickness, the VHF power supply is stopped, and the outlet valves are closed to stop the gas introduction to the reaction chamber and to finish the formation of the photoconductive layer.

In the case where a surface layer, a charge injection-inhibiting layer, or another layer is formed for the electrophotographic photosensitive member, or where a layer for uses other than an electrophotographic photosensitive member is formed, the similar operations are conducted in principle.

During the film formation, the substrate 3115 is preferably rotated at a prescribed rate by a driving mechanism 3120.

Figure 7A:
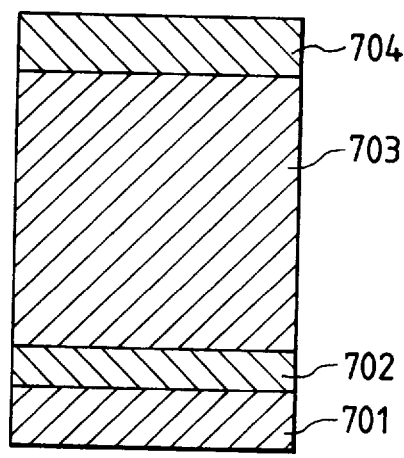
FIG. 7A, and FIG. 7B are respectively a schematic drawing for explaining an example of the layer constitution of the electrophotographic photosensitive member.
Figure 7B:
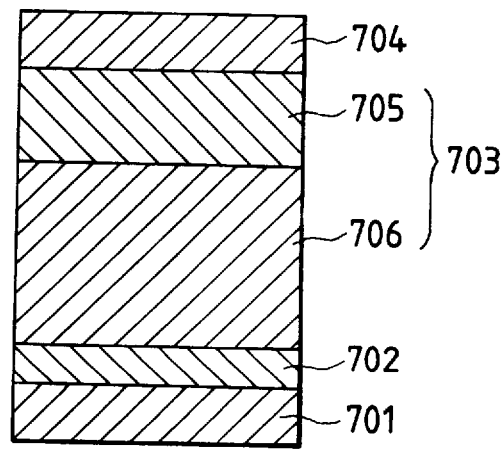

An example of a deposition film formed by the apparatus of the present invention is an amorphous silicon (a-Si) photosensitive member which is a non-single crystalline semiconductor. FIG. 7A and FIG. 7B are schematic sectional views showing typical layer structures of an a-Si photosensitive member. FIG. 7A illustrates a single layer type photosensitive member which is constituted of a single photoconductive layer not functionally separated. FIG. 7B illustrates an example of a function-separation type photosensitive member in which the photosensitive layer is constituted of functionally separated layers of a charge-generating layer primarily generating electric charge on light irradiation and a charge-transporting layer primarily transporting the electric charge.

The a-Si photosensitive member shown in FIG. 7A comprises an electroconductive substrate 701 made of aluminum or the like, and a charge injection-inhibiting layer 702, a photoconductive layer 703, and a surface layer 704 built up in the named order on the electroconductive substrate. The charge injection-inhibiting layer 702 is a layer for inhibiting unnecessary charge injection from the electroconductive substrate 701 into the photoconductive layer 703. This layer may be provided when it is necessary. The photoconductive layer 703 is made from an amorphous material containing at least silicon atoms and exhibits photoconductivity. The surface layer 704 contains, for example, silicon atoms and carbon atoms (additionally hydrogen atoms and/or halogen atoms, if necessary), and is capable of retaining an developed image in an electrophotographic apparatus. In the description below, the charge injection-inhibiting layer 702 is assumed to be present, except for the case where the presence or absence thereof gives different effect.

The a-Si type photosensitive member shown in FIG. 7B is different in construction of the photoconductive layer 703 from the one shown in FIG. 7A. The a-Si photosensitive member in FIG. 7B has a function-separation type of photoconductive layer 703 formed by building up a charge-transporting layer 706 constituted of an amorphous material containing at least silicon atoms and carbon atoms, and a charge-generating layer 705 constituted of another amorphous material containing at least silicon atoms (in FIG. 7B, the layers are built up successively in the named order). On light irradiation onto this photosensitive member, carriers mainly generated in the charge-generating layer move through the charge-transporting layer to the electroconductive substrate 701.

The present invention is described more specifically by reference to Experiments and Examples without limiting the invention in any way.

Experiment 1

Deposition films were formed with the plasma CVD apparatus shown in FIG. 2 by application of VHF power of 100 W, 300 W, or 500 W to the cathode at a discharge frequency of 105 MHz, and by application of a DC voltage in the range of from −300 V to +300 V to the substrate. Other conditions are shown in Table 1. The dependency of the uniformity of the thickness of the formed deposition film on the level of the applied DC voltage was investigated.

TABLE 1

Film Forming Conditions by Plasma CVD

| | |
|---|---|
| $SiH_4$ | 400 sccm |
| $H_2$ | 400 sccm |
| Substrate temperature | 250° C. |
| Pressure | 20 mTorr |
| VHF power | 100 W, 300 W, or 500 W |

[Evaluation of Film Thickness Distribution]

The film thickness was measured at 27 points in the axis direction for each of the photosensitive members by means of an eddy-current instrument for measuring thickness (manufactured by Kett Kagaku Kenkyusho K.K.). The film thickness distribution ratio was calculated for each film by dividing the difference between the largest thickness and the smallest thickness by the average thickness. The film thickness distribution ratio was evaluated by the relative value to the same ratio for the film formed on a grounded substrate with high frequency power of 100 W in Example 1 taken as 1.0. Thus, the smaller ratio means the more uniform thickness.

Figure 8:
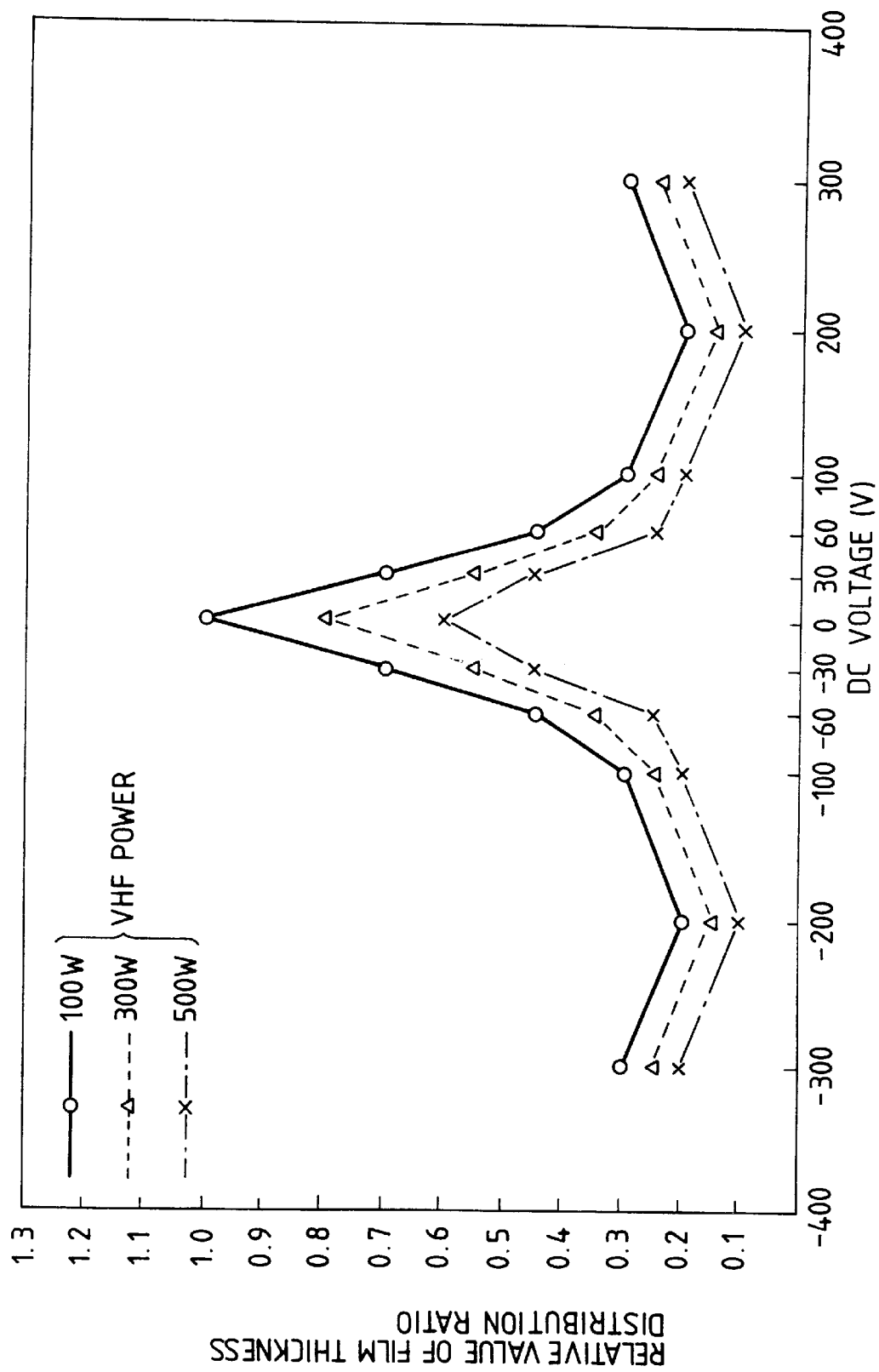
FIG. 8 is a graph showing the dependence of the relative value of the film thickness distribution ratio on the voltage applied by the DC power source.

As the results, within the range of the DC voltage applied to the substrate of from 30 V to 300 V or from −30 V to −300 V, the film thickness distribution ratio was not higher than 0.7 at any of the above VHF power levels as shown in FIG. 8. The film thickness distribution ratio decreased with the increase of the absolute value of the applied DC voltage up to a certain level, and then increased above that absolute value of the voltage, regardless of the level of the applied high frequency power.

At the absolute DC voltage of less than 30 V, the uniformity of the film thickness was not always improved sufficiently owing to localized discharge in the discharge space, whereas at the absolute value of the DC voltage of higher than 300 V, abnormal discharge occurred, and the deposition film sometimes peeled off during the film deposition, and the improvement could not always be achieved.

Experiment 2

Deposition films were formed with the plasma CVD apparatus shown in FIG. 2 by application of VHF power of 100 W, 300 W, or 500 W to the cathode at a discharge frequency 105 MHz, and by application of an AC voltage in the range of from 0 V to 600 V to the substrate 1112. Other film-forming conditions were as shown in Table 1. The uniformity of the thickness of the formed deposition film on the level of the applied AC voltage was measured and evaluated in the same manner as in Experiment 1.

The AC voltage employed was sine-wave, and 100 Hz in frequency in this Experiment.

Figure 9:
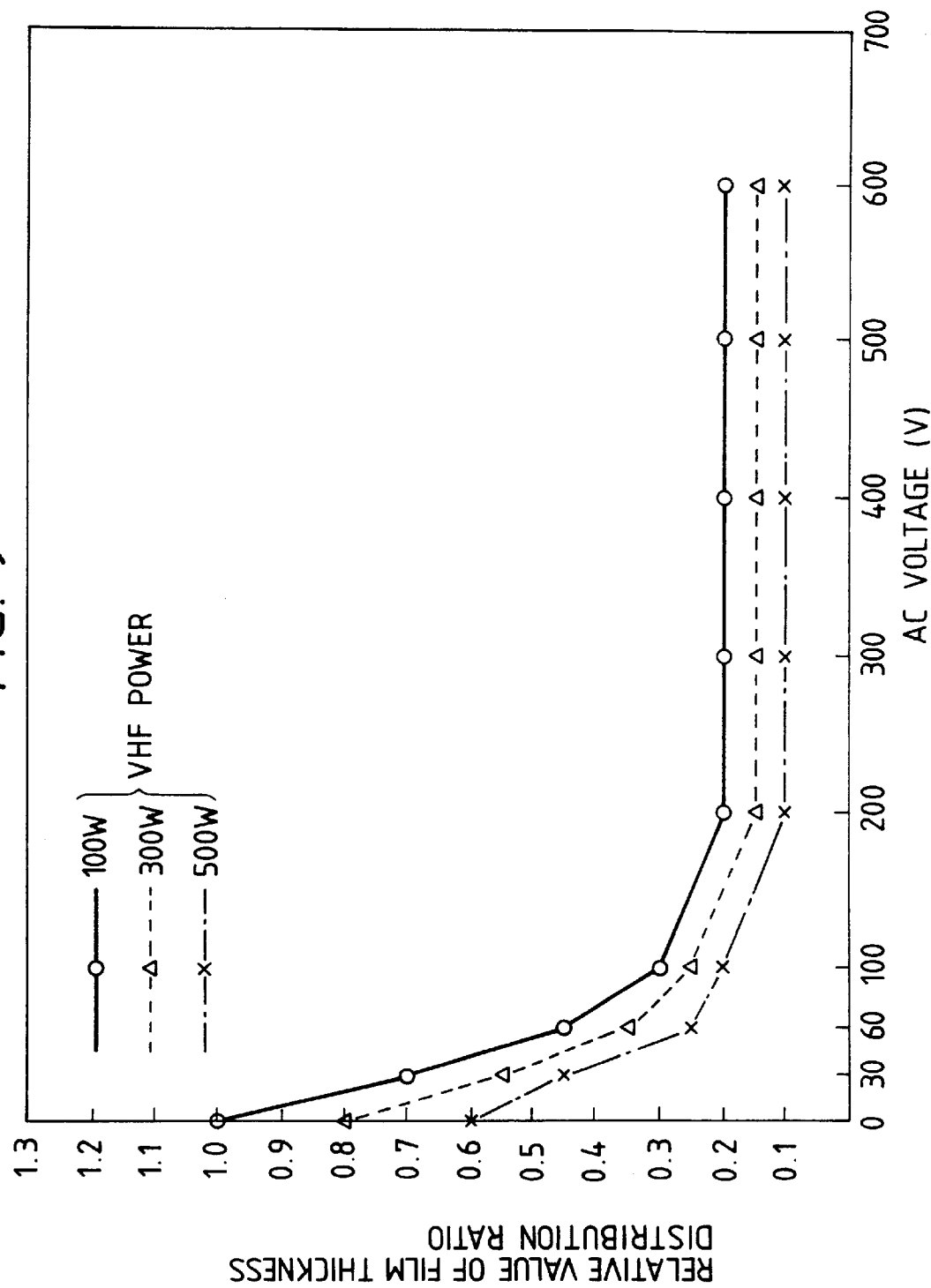
FIG. 9 is a graph showing the dependence of the relative value of the film thickness distribution ratio on the voltage applied by the AC power source.

Consequently as shown in FIG. 9, within the range of the AC voltage applied to the substrate of from 30 V to 600 V, the thickness distribution ratio was not higher than 0.7 at any of the above VHF power levels. The film thickness distribution ratio decreased with the increase of the applied AC voltage up to a certain voltage (200 V in FIG. 9), and the improvement was saturated above that voltage, independently of the level of the applied high frequency power.

At the AC voltage of above 600 V, the discharge tended to be instable, abnormal, and intermittent frequently to cause irregularity of film thickness. At the AC voltage below 30 V, the effects of the present invention are not always achieved sufficiently.

Experiment 3

Deposition films were formed with the plasma CVD apparatus shown in FIG. 2 in the same manner as in Experiment 1 and Experiment 2 except that the discharge frequency was changed to 20 MHz, 31 MHz, 50 MHz, 300 MHz, or 450 MHz. Other film-forming conditions are shown in Table 1. The dependency of the uniformity of the thickness of the formed deposition film on the discharge frequency was measured in the same manner as in Experiment 1.

As the results, the film thickness uniformity showed similar tendency as in Experiment 1 and Experiment 2, and the film thickness distribution ratio was not higher than 0.7 satisfactorily. The results were highly satisfactory at the frequency of particularly 31 MHz or higher, and more particularly 50 MHz or higher. Therefore, the effects of the present invention could be achieved at the frequency of the high frequency power within the range of from 20 MHz to 450 MHz.

Comparative Experiment 1

Deposition films were formed with the plasma CVD apparatus shown in FIG. 2 in the same manner as in Experiment 1 and Experiment 2 except that the discharge frequency was changed to 13.56 MHz, or 500 MHz. Other conditions are shown in Table 1. The uniformity of the thickness of the formed deposition film was investigated in the same manner as in Experiment 1.

Consequently, at the discharge frequency of 13.56 MHz, the uniformity of the film thickness was sufficient satisfactorily as in Experiment 1 and Experiment 2, but the intended increase of film deposition rate of the present invention could not be achieved.

At the discharge frequency above 450 MHz, the design of the high frequency matching circuit was found to be difficult, and the transmission loss was found to be large, so that the practicably satisfactory performance could not be obtained at the discharge frequency of 500 MHz.

The present invention is explained by reference to Examples.

EXAMPLE 1

A—Si films were formed on cylindrical aluminum substrates with a plasma CVD apparatus as shown in FIG. 2 at a discharge frequency of 105 MHz to prepare electrophotographic photosensitive members. Four photosensitive members were prepared in this Example by application of a DC voltage of −300 V, −100 V, +100 V, or +300 V. The substrates were kept stationary without rotation during the film formation. The film forming conditions were as shown in Table 2.

TABLE 2

| Layer | Conditions | |
|---|---|---|
| Lower inhibition layer | $SiH_4$ | 300 sccm |
| | $H_2$ | 500 sccm |
| | NO | 8 sccm |
| | $B_2H_6$ | 2000 ppm |
| | Power | 400 W |
| | Internal pressure | 20 mTorr |
| | Film thickness | 1 μm |
| Photo-conductive layer | $SiH_4$ | 500 sccm |
| | $H_2$ | 500 sccm |
| | Power | 100 W |
| | Internal pressure | 30 mTorr |
| | Film thickness | 20 μm |
| Surface-protecting layer | $SiH_4$ | 50 sccm |
| | $CH_4$ | 500 sccm |
| | Power | 100 W |
| | Internal pressure | 20 mTorr |
| | Film thickness | 1 μm |

The resulting electrophotographic photosensitive members were evaluated for electrophotographic properties and image quality by using a modified model of a copying machine NP-5060 (Canon K.K.). The evaluation was conducted as below.

(a) Electrophotographic properties

The respective photosensitive members are evaluated for uniformity in chargeability, and sensitivity by means of the modified NP-5060 copying machine.

Uniformity of chargeability

Corona charging is conducted onto the surface of the photosensitive member by applying electric current of 1000 µA to the corona assembly. The surface potential of the photosensitive member is measured by surface potential tester, and the variation of the potential in the axis direction of the photosensitive member is measured.

Sensitivity

The photosensitive member is charged to a prescribed dark-area surface potential, and is immediately subjected to image exposure. The sensitivity is shown by the amount of light required to obtain the prescribed light-area surface potential.

(b) Discharging state

The discharging state is evaluated in terms of four levels of evaluation standards of excellent, good, fair and poor by observing introduced and reflected waves of the applied high frequency power when they are adjusted by the matching device.

The evaluation is made by the standard below:

Chargeability

Excellent: Substantially no variation observed in surface potential

Good: The variation being within ±20 V

Fair: No problem practically, no problem in copied images

Poor: Some problems in practical use; non-uniformity observed in copied half-tone image Sensitivity Excellent: Substantially uniform Good: The amount of light for obtaining the prescribed potential being within ±10%

Fair: No problem practically, no problem in copied images

Poor: Some problems in practical use; nonuniformity observed in copied half-tone image (c) Durability Continuous running test is conducted for A4-size copying by continuous feeding of A4-size paper sheets with a modified model of a copying machine NP-5060 (Canon K.K.). Cleaning state of the photosensitive member was observed. The cleaning state is evaluated according to the standards below:

Good: No black streak being found on white blank image

Fair: A few black streak of 2–3 cm long found on white blank image

Poor: A few black streak of 5 cm or longer found on white blank image

The results are shown in Table 6 and Table 7.

In this Example of the present invention, the resulting photosensitive members had excellent electrophotographic properties and formed excellent images with uniform potential distribution and uniform image density as shown in Table 3 and Table 4. No image defects such as white dots were observed, and the durability was satisfactory without occurrence of defective cleaning.

Observation of the surface of the above electrophotographic photosensitive members with an inverted-type metallographical microscope (Versamet-2, Union Optical Co., Ltd.) revealed that spherical protrusions of 20 µm or larger which will cause defective cleaning were found to be 10 or less in number on the respective electrophotographic photosensitive members produced by application of the negative DC voltage, and not found on the respective electrophotographic photosensitive members produced by application of the positive DC voltage. Therefrom, application of a positive DC voltage during the film formation was found to be more effective in preventing the formation of spherical protrusions.

Comparative Example 1

An a-Si film was formed on a cylindrical aluminum substrate with a plasma CVD apparatus as shown in FIG. 1 at a discharge frequency of 105 MHz to prepare an electrophotographic photosensitive member. The lower portion of the substrate was connected to the ground. The substrate was kept stationary without rotation during the film formation. The film forming conditions were as shown in Table 2.

The electrophotographic phtotsensitive member was evaluated by using a modified model of a copying machine NP-5060 (Canon K.K.). The evaluation was conducted in the same manner as in Example 1. The results are shown in Table 10 and Table 11.

In this Comparative Example, potential variation and image density nonuniformity were caused. The photosensitive member obtained was practically usable. However, excellent electrophotographic properties and high image quality were not obtained Defective cleaning occurred at 1,000,000 sheets of continuous copying.

Observation of the surface of the above electrophotographic photosensitive member with an inverted-type metallographical microscope (Versamet-2, Union Optical Co., Ltd.) revealed that spherical protrusions of 20 µm or larger which will cause defective cleaning were found to exist 20 to 30 in number. However, the protrusions did not impair the initial image properties, and caused no trouble in practical use.

EXAMPLE 2

A—Si films were formed on cylindrical aluminum substrates with a plasma CVD apparatus as shown in FIG. 2 at a discharge frequency of 50 MHz to prepare electrophotographic photosensitive members. Four photosensitive members were prepared in this Example by application of a DC voltage of −300 V, −100 V, +100 V, or +300 V. The substrates were kept stationary without rotation during the film formation. The film forming conditions were as shown in Table 3.

TABLE 3

| Layer | Conditions | |
|---|---|---|
| Lower inhibition layer | $SiH_4$ | 300 sccm |
| | $H_2$ | 500 sccm |
| | NO | 8 sccm |
| | $B_2H_6$ | 2000 ppm |
| | Power | 400 W |
| | Internal pressure | 20 mTorr |
| | Film thickness | 1 µm |
| Photo-conductive layer | $SiH_4$ | 500 sccm |
| | $H_2$ | 500 sccm |
| | Power | 300 W |
| | Internal pressure | 30 mTorr |
| | Film thickness | 20 µm |
| Surface- | $SiH_4$ | 50 sccm |

TABLE 3-continued

| Layer | Conditions | | |
|---|---|---|---|
| protecting layer | $CH_4$<br>Power<br>Internal pressure<br>Film thickness | 500<br>100<br>20<br>1 | sccm<br>W<br>mTorr<br>μm |

The electrophotographic photosensitive members were evaluated for electrophotographic properties and image quality by using a modified model of a copying machine NP-5060 (Canon K.K.). The evaluation was conducted in the same manner as in Example 1. The results are shown in Table 6 and Table 7.

The resulting photosensitive members had excellent electrophotographic properties with uniform potential distribution, and formed excellent images with uniform image density. No image defects such as white dots were observed, and the durability was satisfactory without occurrence of defective cleaning.

Observation of the surface of the above electrophotographic photosensitive members with an inverted-type metallographical microscope (Versamet-2, Union Optical Co., Ltd.) revealed that the spherical protrusions of 20 μm or larger which will cause defective cleaning were found to be 10 or less in number on the respective electrophotographic photosensitive members produced by application of the negative DC voltage, and not found on the electrophotographic photosensitive members produced by application of the positive DC voltage.

Comparative Example 2

An a-Si film was formed on a cylindrical aluminum substrate with a plasma CVD apparatus as shown in FIG. 1 at a discharge frequency of 50 MHz to prepare an electrophotographic photosensitive member. The lower portion of the substrate was connected to the ground. The substrate was kept stationary without rotation during the film formation. The film forming conditions were as shown in Table 3.

The electrophotographic photosensitive member was evaluated by using a modified model of a copying machine NP-5060 (Canon K.K.). The evaluation was conducted in the same manner as in Example 1. The results are shown in Table 10 and Table 11.

As the results, potential variation and image density nonuniformity were caused, and the electrophotographic properties and the image quality were not satisfactory. Cleaning became defective at 800,000 sheets of continuous copying.

Observation of the surface of the above electrophotographic photosensitive member with an inverted-type metallographical microscope (Versamet-2, Union Optical Co., Ltd.) revealed that spherical protrusions of 20 μm or larger which will cause defective cleaning were found to exist 20 to 30 in number. However, the protrusions did not impair the initial image properties, and caused no trouble in practical use.

EXAMPLE 3

A—Si films were formed on cylindrical aluminum substrates with a plasma CVD apparatus as shown in FIG. 2 at a discharge frequency of 350 MHz to prepare electrophotographic photosensitive members. Four photosensitive members were prepared in this Example by application of a DC voltage of −300 V, −100 V, +100 V, or +300 V. The substrates were kept stationary without rotation during the film formation. The film forming conditions were as shown in Table 4.

TABLE 4

| Layer | Conditions | | |
|---|---|---|---|
| Lower inhibition layer | $SiH_4$<br>$H_2$<br>NO<br>$B_2H_6$<br>Power<br>Internal pressure<br>Film thickness | 300<br>500<br>8<br>2000<br>400<br>20<br>1 | sccm<br>sccm<br>sccm<br>ppm<br>W<br>mTorr<br>μm |
| Photo-conductive layer | $SiH_4$<br>$H_2$<br>Power<br>Internal pressure<br>Film thickness | 500<br>500<br>600<br>30<br>20 | sccm<br>sccm<br>W<br>mTorr<br>μm |
| Surface protecting layer | $SiH_4$<br>$CH_4$<br>Power<br>Internal pressure<br>Film thickness | 50<br>500<br>100<br>20<br>1 | sccm<br>sccm<br>W<br>mTorr<br>μm |

The obtained electrophotographic photosensitive members were evaluated for electrophotographic properties and image quality by using a modified model of a copying machine NP-5060 (Canon K.K.). The evaluation was conducted in the same manner as in Example 1. The results are shown in Table 6 and Table 7.

The resulting photosensitive members had excellent electrophotographic properties with uniform potential distribution, and formed excellent images with uniform image density. No image defects such as white dots were observed, and the durability was satisfactory without occurrence of defective cleaning.

Observation of the surface of the above electrophotographic photosensitive members with an inverted-type metallographical microscope (Versamet-2, Union Optical Co., Ltd.) revealed that the spherical protrusions of 20 μm or larger which will cause defective cleaning were found to be 10 or less in number on the respective electrophotographic photosensitive members produced by application of the negative DC voltage, and not found on the electrophotographic photosensitive members produced by application of the positive DC voltage.

Comparative Example 3

An a-Si film was formed on a cylindrical aluminum substrate with a plasma CVD apparatus as shown in FIG. 1 at a discharge frequency of 350 MHz to prepare an electrophotographic photosensitive member. The lower portion of the substrate was connected to the ground. The substrate was kept stationary without rotation during the film formation. The film forming conditions were as shown in Table 4.

The obtained electrophotographic photosensitive member was evaluated for electrophotographic properties and image quality by using a modified model of a copying machine NP-5060 (Canon K.K.). The evaluation was conducted in the same manner as in Example 1. The results are shown in Table 10 and Table 11.

As the results, potential variation and image density nonuniformity were caused, and the electrophotographic properties and the image quality were not satisfactory. Cleaning became defective at 500,000 sheets of continuous copying.

Observation of the surface of the above electrophotographic photosensitive member with an inverted-type metallographical microscope (Versamet-2, Union Optical Co., Ltd.) revealed that spherical protrusions of 20 µm or larger which will cause defective cleaning were found to exist 20 to 30 in number on the electrophotographic photosensitive member. However, the protrusions did not impair the initial image properties, and caused no trouble in practical use.

EXAMPLE 4

A—Si films were formed on cylindrical aluminum substrates with a plasma CVD apparatus as shown in FIG. 2 at a discharge frequency of 105 MHz to prepare electrophotographic photosensitive members. Three photosensitive members were prepared in this Example by application of an AC voltage of 100 V, 300 V, or 600 V. The substrate was kept stationary without rotation during the film formation. The wave-form of the AC voltage was sine wave, and the frequency thereof was 100 Hz. The film forming conditions were as shown in Table 2.

The obtained electrophotographic photosensitive members were evaluated for electrophotographic properties and image quality by using a modified model of a copying machine NP-5060 (Canon K.K.). The evaluation was conducted in the same manner as in Example 1. The results are shown in Table 7 and Table 8.

The resulting photosensitive members had excellent electrophotographic properties with uniform potential distribution, and formed excellent images with uniform image density. No image defects such as white dots were observed, and the durability was satisfactory without occurrence of defective cleaning.

Observation of the surface of the above electrophotographic photosensitive members with an inverted-type metallographical microscope (Versamet-2, Union Optical Co., Ltd.) revealed that no spherical protrusions of 20 µm or larger which will cause defective cleaning was found.

EXAMPLE 5

A—Si films were formed on cylindrical aluminum substrates with a plasma CVD apparatus as shown in FIG. 2 at a discharge frequency of 50 MHz to prepare electrophotographic photosensitive members. Three photosensitive members were prepared in this Example by application of an AC voltage of 100 V, 300 V, or 600 V. The substrate was kept stationary without rotation during the film formation. The wave form of the AC voltage was sine wave, and the frequency thereof was 100 Hz. The film forming conditions were as shown in Table 3.

The obtained electrophotographic photosensitive members were evaluated for electrophotographic properties and image quality by using a modified model of a copying machine NP-5060 (Canon K.K.). The evaluation was conducted in the same manner as in Example 1. The results are shown in Table 7 and Table 8.

The resulting photosensitive members had excellent electrophotographic properties with uniform potential distribution, and formed excellent images with uniform image density. No image defects such as white dots were observed, and the durability was satisfactory without occurrence of defective cleaning.

Observation of the surface of the above electrophotographic photosensitive members with an inverted-type metallographical microscope (Versamet-2, Union Optical Co., Ltd.) revealed that no spherical protrusions of 20 µm or larger which will cause defective cleaning was found.

EXAMPLE 6

A—Si films were formed on cylindrical aluminum substrates with a plasma CVD apparatus as shown in FIG. 2 at a discharge frequency of 350 MHz to prepare electrophotographic photosensitive members. Three photosensitive members were prepared in this Example by application of an AC voltage of 100 V, 300 V, or 600 V. The substrate was kept stationary without rotation during the film formation. The wave-form of the AC voltage was sine wave, and the frequency thereof was 100 Hz. The film forming conditions were as shown in Table 2.

The electrophotographic photosensitive members were evaluated for electrophotographic properties and image quality by using a modified model of a copying machine NP-5060 (Canon K.K.). The evaluation was conducted in the same manner as in Example 1. The results are shown in Table 7 and Table 8.

The resulting photosensitive members had excellent electrophotographic properties with uniform potential distribution, and formed excellent images with uniform image density. No image defect such as white dots was observed, and the durability was satisfactory without occurrence of defective cleaning.

Observation of the surface of the above electrophotographic photosensitive members with an inverted-type metallographical microscope (Versamet-2, Union Optical Co., Ltd.) revealed that no spherical protrusion of 20 µm or larger which will cause defective cleaning was found.

EXAMPLE 7

A—Si films were formed on cylindrical aluminum substrates with a plasma CVD apparatus as shown in FIG. 3 at a discharge frequency of 105 MHz to prepare electrophotographic photosensitive members. Two photosensitive members were prepared in this Example by application of a DC voltage of −300 V and an AC voltage of 100 V, or a DC voltage of 300 V and an AC voltage of 100 V, to the substrate. The substrates were kept stationary without rotation during the film formation. The wave-form of the AC voltage was rectangular, and the frequency thereof was 60 Hz. The film forming conditions were as shown in Table 3.

The electrophotographic photosensitive members were evaluated for electrophotographic properties and image quality by using a modified model of a copying machine NP-5060 (Canon K.K.). The evaluation was conducted in the same manner as in Example 1. The results are shown in Table 7 and Table 9.

The resulting photosensitive members had excellent electrophotographic properties with uniform potential distribution, and formed excellent images with uniform image density. No image defect such as white dots was observed, and the durability was satisfactory without occurrence of defective cleaning.

Observation of the surface of the above electrophotographic photosensitive members with an inverted metallographical microscope (Versamet-2, Union Optical Co., Ltd.) revealed that no spherical protrusion of 20 µm or larger which will cause defective cleaning was found.

EXAMPLE 8

A—Si films were formed on cylindrical aluminum substrates with a plasma CVD apparatus as shown in FIG. 3 at a discharge frequency of 105 MHz to prepare electrophotographic photosensitive members. Two sensitive members were prepared in this Example by application of a DC voltage of −300 V and an AC voltage of 300 V , or a DC voltage of 300 V and an AC voltage of 300 V to the substrate. The substrate was kept stationary without rotation during the film formation. The AC voltage was rectangular wave of a duty ratio of 1 and a frequency of 60 Hz. The film forming conditions were as shown in Table 3.

The obtained electrophotographic photosensitive members were evaluated for electrophotographic properties and image quality by using a modified model of a copying machine NP-5060 (Canon K.K.). The evaluation was conducted in the same manner as in Example 1. The results are shown in Table 7 and Table 9.

The resulting photosensitive members had excellent electrophotographic properties with uniform potential distribution, and formed excellent images with uniform image density. No image defect such as white dots was observed, and the durability was satisfactory without occurrence of defective cleaning.

Observation of the surface of the above electrophotographic photosensitive members with an inverted-type metallographical microscope (Versamet-2, Union Optical Co., Ltd.) revealed that no spherical protrusion of 20 μm or larger which will cause defective cleaning was found.

EXAMPLE 9

A—Si films were formed on cylindrical aluminum substrates with a plasma CVD apparatus as shown in FIG. 3 at a discharge frequency of 105 MHz to prepare electrophotographic photosensitive members. Two sensitive members were prepared in this Example by application of a DC voltage of −300 V and an AC voltage of 600 V, or a DC voltage of 300 V and an AC voltage of 600 V to the substrate. The substrates were kept stationary without rotation during the film formation. The AC voltage was rectangular wave of a duty ratio of 1 and a frequency of 60 Hz. The film forming conditions were as shown in Table 3.

The electrophotographic photosensitive members were evaluated for electrophotographic properties and image quality by using a modified model of a copying machine NP-5060 (Canon K.K.). The evaluation was conducted in the same manner as in Example 1. The results are shown in Table 7 and Table 9.

The resulting photosensitive members had excellent electrophotographic properties with uniform potential distribution, and formed excellent images with uniform image density. No image defect such as white dots was observed, and the durability was satisfactory without occurrence of defective cleaning.

Observation of the surface of the above electrophotographic photosensitive members with an inverted-type metallographical microscope (Versamet-2, Union Optical Co., Ltd.) revealed that no spherical protrusion of 20 μm or larger which will cause defective cleaning was found.

As shown in Tables, in the case where a deposition film is formed at a high rate without application of a voltage to the first electrode, the discharge is not stable sufficiently, so that the thickness of the formed deposition film can be nonuniform, and the electrophotographic properties and image density can be nonuniform. Further in this case, with increase of discharge power, image defects tend to occur, and the cleaning is liable to be defective.

On the other hand, according to the present invention, even in high-rate film formation, the discharge is stable, the formed photosensitive layer has excellent electrophotographic properties and gives uniform density of the image, and cleaning is conducted satisfactorily for 1,000,000 sheets of continuous copying without defective cleaning.

It has also been found that generation of spherical protrusions which will cause cleaning failure is further inhibited by application of a positive DC voltage and/or an AC voltage as a bias applied to the substrate to be processed. It has been found further that superposition of an AC voltage on a negative DC voltage as the bias is effective in inhibiting the generation of the spherical protrusions in comparison with simple application of negative DC voltage.

EXAMPLE 10

A—Si films were formed on cylindrical aluminum substrates with an industrial plasma CVD apparatus as shown in FIG. 4 at a discharge frequency of 105 MHz to prepare electrophotographic photosensitive members Four kinds of photosensitive members were prepared in this Example by application of a DC voltage of −300 V, −100 V, +100 V, or +300 V: six sensitive members for respective kinds, 24 members in total. The film forming conditions were as shown in Table 3.

The obtained electrophotographic photosensitive members were evaluated in the same manner as in Example 1. The resulting photosensitive member had excellent electrophotographic properties without variation in the axis direction as in Example 2. The six photosensitive members produced under the same conditions were produced stably and were uniform substantially in the electrophotographic properties and the film thickness.

Observation of the surface of the above electrophotographic photosensitive members with an inverted-type metallographical microscope (Versamet-2, Union Optical Co., Ltd.) revealed that the spherical protrusions of 20 μm or larger which will cause defective cleaning were found to be 10 or less in number on the respective electrophotographic photosensitive members produced by application of the negative DC voltage, and not found on the electrophotographic photosensitive members produced by application of the positive DC voltage.

EXAMPLE 11

A—Si films were formed on cylindrical aluminum substrates with an industrial plasma CVD apparatus as shown in FIG. 4 at a discharge frequency of 105 MHz to prepare electrophotographic photosensitive members. Three kinds of photosensitive members were prepared in this Example by application of an AC voltage of 100 V, 300 V, or 600 V: 6 members for each kinds, 18 members in total. The waveform of the AC voltage was sine wave, and the frequency thereof was 200 Hz. The film forming conditions were as shown in Table 3.

The electrophotographic photosensitive members were evaluated in the same manner as in Example 1. The resulting photosensitive members had excellent electrophotographic properties without variation in the axis direction as in Example 5. The six photosensitive members produced under the same conditions were produced stably and were uniform substantially in the electrophotographic properties and the film thickness.

Observation of the surface of the above electrophotographic photosensitive members with an inverted-type metallographical microscope (Versamet-2, Union Optical Co., Ltd.) revealed that the spherical protrusions of 20 μm or larger which will cause defective cleaning were not found.

EXAMPLE 12

A—Si films were formed on cylindrical aluminum substrates with an industrial plasma CVD apparatus as shown in FIG. 4 at a discharge frequency of 105 MHz to prepare electrophotographic photosensitive members. Two kinds of photosensitive members were prepared in this Example by application of a DC voltage of −300 V and an AC voltage of 300 V, or a DC voltage of 300 V and an AC voltage of 300 V to the substrate: 6 members for each kind, 12 members in total. The wave-form of the AC voltage was sine wave, and the frequency thereof was 200 Hz. The film forming conditions were as shown in Table 3.

The obtained electrophotographic photosensitive members were evaluated in the same manner as in Example 1. The resulting photosensitive members had excellent electrophotographic properties without variation in the axis direction as in Example 5. The six photosensitive members under the same film-forming conditions were produced stably, and were uniform substantially in the electrophotographic properties and the film thickness.

Observation of the surface of the above electrophotographic photosensitive members with an inverted-type metallographical microscope (Versamet-2, Union Optical Co., Ltd.) revealed that the spherical protrusions of 20 µm or larger which will cause defective cleaning were not found.

From the results of Examples 10 to 12, the effects of the present invention were found to be achieved regardless of the construction of the CVD apparatus.

EXAMPLE 13

A—Si films were formed on cylindrical aluminum substrates with a plasma CVD apparatus as shown in FIG. 2 at a discharge frequency of 105 MHz to prepare electrophotographic photosensitive members. Four photosensitive members were prepared in this Example by application of a DC voltage of −300 V, −100 V, +100 V, or +300 V to the substrate. The substrate was kept stationary without rotation during the film formation. The film forming conditions were as shown in Table 5.

TABLE 5

| Layer | Conditions | |
| --- | --- | --- |
| Lower inhibition layer | $SiH_4$ | 300 sccm |
| | $H_2$ | 500 sccm |
| | NO | 8 sccm |
| | $B_2H_6$ | 2000 ppm |
| | Power | 400 W |
| | Internal pressure | 20 mTorr |
| | Film thickness | 1 µm |
| Charge-transporting layer | $SiH_4$ | 500 sccm |
| | $H_2$ | 500 sccm |
| | $CH_4$ | 50 sccm |
| | Power | 300 W |
| | Internal pressure | 30 mTorr |
| | Film thickness | 15 µm |
| Charge-generating layer | $SiH_4$ | 500 sccm |
| | $H_2$ | 500 sccm |
| | Power | 300 W |
| | Internal pressure | 30 mTorr |
| | Film thickness | 5 µm |
| Surface protecting layer | $SiH_4$ | 50 sccm |
| | $CH_4$ | 500 sccm |
| | Power | 100 W |
| | Internal pressure | 20 mTorr |
| | Film thickness | 1 µm |

The obtained electrophotographic photosensitive members were evaluated in the same manner as in Example 1. The resulting photosensitive members had excellent electrophotographic properties without variation in the axis direction as in Example 2.

Observation of the surface of the above electrophotographic photosensitive members with an inverted-type metallographical microscope (Versamet-2, Union Optical Co., Ltd.) revealed that the spherical protrusions of 20 µm or larger which will cause defective cleaning was found to be 10 or less in number on the respective electrophotographic photosensitive members produced by application of the negative DC voltage, and not found on the electrophotographic photosensitive members produced by application of the positive DC voltage.

EXAMPLE 14

A—Si films were formed on cylindrical aluminum substrates with a plasma CVD apparatus as shown in FIG. 2 at a discharge frequency of 105 MHz to prepare electrophotographic photosensitive members. Three photosensitive members were prepared in this Example by application of an AC voltage of 100 V, 300 V, or 600 V to the substrate. The substrate was kept stationary without rotation during the film formation. The wave-form of the AC voltage was sine wave, and the frequency thereof was 500 Hz. The film forming conditions were as shown in Table 5.

The electrophotographic photosensitive members were evaluated in the same manner as in Example 1. The resulting photosensitive members had excellent electrophotographic properties without variation in the axis direction as in Example 5.

Observation of the surface of the above electrophotographic photosensitive members with an inverted-type metallographical microscope (Versamet-2, Union Optical Co., Ltd.) revealed that the spherical protrusions of 20 µm or larger which will cause defective cleaning were not found.

EXAMPLE 15

A—Si films were formed on cylindrical aluminum substrates with a plasma CVD apparatus as shown in FIG. 3 at a discharge frequency of 105 MHz to prepare electrophotographic photosensitive members. Two photosensitive members were prepared in this Example by application of a DC voltage of −300 V and an AC voltage of 300 V, or a DC voltage of 300 V and an AC voltage of 300 V to the substrate. The substrate was kept stationary without rotation during the film formation. The applied AC voltage was sine wave of a frequency of 500 Hz. The film forming conditions were as shown in Table 5.

The obtained electrophotographic photosensitive members were evaluated in the same manner as in Example 1. The photosensitive members had excellent electrophotographic properties without variation in the axis direction as in Example 8.

Observation of the surface of the above electrophotographic photosensitive members with an inverted-type metallographical microscope (Versamet-2, Union Optical Co., Ltd.) revealed that the spherical protrusions of 20 µm or larger which will cause defective cleaning were not found.

From the results of Examples 13 to 15, the effects of the present invention were found to be achieved independently of the layer construction of deposited films.

EXAMPLE 16

A—Si films were formed on cylindrical aluminum substrates with a plasma CVD apparatus as shown in FIG. 3 at a discharge frequency of 105 MHz to prepare electrophotographic photosensitive members. AC voltage of 300 V was applied to the substrates in this Example. The substrate was kept stationary without rotation during the film formation. The wave-form of the AC voltage was sine wave, and the frequency thereof was 500 Hz, 1 MHz, or 2 MHz. Three photosensitive members were produced for each of the three AC frequency levels. The film forming conditions were as shown in Table 2.

The electrophotographic photosensitive members were evaluated for electrophotographic properties and image quality by using a modified model of a copying machine NP-5060 (Canon K.K.). The evaluation was conducted in the same manner as in Example 1.

The photosensitive members which were produced at the AC frequency of 500 Hz or 1 MHz had excellent electrophotographic properties with uniform potential distribution, and formed excellent images with uniform image density. No image defects such as white dots were observed, and the durability was satisfactory without occurrence of defective cleaning.

Observation of the surface of the above electrophotographic photosensitive members with an inverted-type metallographical microscope (Versamet-2, Union Optical Co., Ltd.) revealed that no spherical protrusion of 20 μm or larger which will cause defective cleaning was found.

On the other hand, for the production with the AC frequency of 2 MHz, abnormal discharge occurred during the film deposition, which caused peeling off of the deposited film.

From the above results, the AC voltage applied to the substrate is preferably of a frequency of less than 2 MHz.

TABLE 6

|  | DC | Uniformity of chargeability | Sensitivity | Discharge state |
|---|---|---|---|---|
| Example 1 | −300 V | Excellent | Excellent | Excellent |
|  | −100 V | Excellent | Excellent | Excellent |
|  | 100 V | Excellent | Excellent | Excellent |
|  | 300 V | Excellent | Excellent | Excellent |
| Example 2 | −300 V | Excellent | Excellent | Excellent |
|  | −100 V | Excellent | Excellent | Excellent |
|  | 100 V | Excellent | Excellent | Excellent |
|  | 300 V | Excellent | Excellent | Excellent |
| Example 3 | −300 V | Excellent | Excellent | Excellent |
|  | −100 V | Excellent | Excellent | Excellent |
|  | 100 V | Excellent | Excellent | Excellent |
|  | 300 V | Excellent | Excellent | Excellent |

TABLE 7

| | Bias voltage | | $1 \times 10^5$ | $5 \times 10^5$ | $8 \times 10^5$ | $10 \times 10^5$ |
|---|---|---|---|---|---|---|
| | DC | AC | sheets | sheets | sheets | sheets |
| Example 1 | −300 V | | Good | Good | Good | Good |
| | −100 V | | Good | Good | Good | Good |
| | 100 V | | Good | Good | Good | Good |
| | 300 V | | Good | Good | Good | Good |
| Example 2 | −300 V | | Good | Good | Good | Good |
| | −100 V | | Good | Good | Good | Good |
| | 100 V | | Good | Good | Good | Good |
| | 300 V | | Good | Good | Good | Good |
| Example 3 | −300 V | | Good | Good | Good | Good |
| | −100 V | | Good | Good | Good | Good |
| | 100 V | | Good | Good | Good | Good |
| | 300 V | | Good | Good | Good | Good |
| Example 4 | | 100 V | Good | Good | Good | Good |
| | | 300 V | Good | Good | Good | Good |
| | | 600 V | Good | Good | Good | Good |
| Example 5 | | 100 V | Good | Good | Good | Good |
| | | 300 V | Good | Good | Good | Good |
| | | 600 V | Good | Good | Good | Good |
| Example 6 | | 100 V | Good | Good | Good | Good |
| | | 300 V | Good | Good | Good | Good |
| | | 600 V | Good | Good | Good | Good |
| Example 7 | −300 V | 100 V | Good | Good | Good | Good |
| | 300 V | 100 V | Good | Good | Good | Good |
| Example 8 | −300 V | 300 V | Good | Good | Good | Good |
| | 300 V | 300 V | Good | Good | Good | Good |

TABLE 7-continued

| | Bias voltage | | $1 \times 10^5$ | $5 \times 10^5$ | $8 \times 10^5$ | $10 \times 10^5$ |
|---|---|---|---|---|---|---|
| | DC | AC | sheets | sheets | sheets | sheets |
| Example 9 | −300 V | 600 V | Good | Good | Good | Good |
| | 300 V | 600 V | Good | Good | Good | Good |

TABLE 8

| | AC | Uniformity of chargeability | Sensitivity | Discharge state |
|---|---|---|---|---|
| Example 4 | 100 V | Excellent | Excellent | Excellent |
| | 300 V | Excellent | Excellent | Excellent |
| | 600 V | Good | Good | Good |
| Example 5 | 100 V | Excellent | Excellent | Excellent |
| | 300 V | Excellent | Excellent | Excellent |
| | 600 V | Good | Good | Good |
| Example 6 | 100 V | Excellent | Excellent | Excellent |
| | 300 V | Excellent | Excellent | Excellent |
| | 600 V | Excellent | Excellent | Excellent |

TABLE 9

| | DC | AC | Uniformity of chargeability | Sensitivity | Discharge state |
|---|---|---|---|---|---|
| Example 7 | −300 V | 100 V | Excellent | Excellent | Excellent |
| | 300 V | 100 V | Excellent | Excellent | Excellent |
| Example 8 | −300 V | 300 V | Excellent | Excellent | Excellent |
| | 300 V | 300 V | Excellent | Excellent | Excellent |
| Example 9 | −300 V | 600 V | Good | Good | Good |
| | 300 V | 600 V | Good | Good | Good |

TABLE 10

| | Uniformity of chargeability | Sensitivity | Discharge state |
|---|---|---|---|
| Comparative Example 1 | Fair | Good | Fair |
| Comparative Example 2 | Fair | Fair | Fair |
| Comparative Example 3 | Fair | Fair | Fair |

TABLE 11

| | Sheets | | | | | |
|---|---|---|---|---|---|---|
| | $5 \times 10^4$ | $1 \times 10^5$ | $3 \times 10^5$ | $5 \times 10^5$ | $8 \times 10^5$ | $10 \times 10^5$ |
| Comparative Example 1 | Good | Good | Good | Good | Good | Fair |
| Comparative Example 2 | Good | Good | Good | Good | Fair | Fair |
| Comparative Example 3 | Good | Good | Good | Fair | Fair | Fair |

Good: No black streak being found on white black image
Fair: A few black streak of 2–3 cm long found
Poor: A few black streak of 5 cm or longer found In the present invention, the surface potential of the first electrode is uniformly stabilized, and sufficient power is uniformly applied throughout the discharge space by application of a DC voltage in a range of from 30 V to 300 V or from −30 V to −300 V and/or an AC voltage in a range of from 30 V to 600 V at a frequency of 2MHz or less to the first electrode, thereby forming a deposition film in a uniform distribution of the film thickness.

The present invention makes it possible to reduce adhesion of a foreign matter such as dust to the first electrode and to decrease spherical protrusions which will cause damage or deterioration of a cleaning blade used in an electrophotographic photosensitive member. This is presumed to be due to non-occurrence of concentration of the electric field onto the dust exposed to the electric discharge. This effect is remarkable when the applied voltage is positive DC voltage or AC voltage.

The present invention, further, makes it practicable to produce electrophotographic photosensitive members with high quality without variation of the film thickness and properties within or between the production lots even with an industrial apparatus producing multiple photosensitive members simultaneously.

Furthermore, the present invention gives additional effects of smaller loss of the applied power, higher utilization efficiency of source gases, and increased rate of the deposition film formation, due to absence of localization of discharge.

Still further, the present invention makes it possible to generate plasma uniformly even at a low power range.

The present invention is not limited by the above description, but may naturally be modified suitably within the gist of the invention.

Naturally, the present invention is applicable not only to the above-described deposition but also to other plasma processing including etching treatment with an etching gas (e.g., $CF_4$) as a source gas, because of uniformization of plasma and improvement in the source gas utilization efficiency.

What is claimed is:

1. A plasma processing method which comprises:
    (a) introducing a source gas into a chamber, said chamber connected to an evacuation means and a source gas-feeding means;
    (b) applying a high frequency power within a frequency range from 20 MHz to 450 MHz between (i) a first electrode provided in said chamber and (ii) a second electrode opposing the first electrode; and
    (c) applying a DC voltage from 100 V, to 300 V or from −300 V to −100 V, to the first electrode, thereby decomposing said source gas and subjecting a surface of the first electrode to plasma processing.

2. The plasma processing method according to claim 1, wherein the discharge frequency is at least 31 MHz.

3. The plasma processing method according to claim 1, wherein the discharge frequency is at least 50 MHz.

4. The plasma processing method according to claim 1, wherein the first electrode is a substrate for an electrophotographic photosensitive member.

5. The plasma processing method according to claim 1, wherein the first electrode is in a shape of a cylinder.

6. The plasma processing method according to claim 1, wherein the plasma processing is conducted to form a deposition film.

7. The plasma processing method according to claim 1, wherein the plasma processing is conducted to form a non-monocrystalline layer.

8. The plasma processing method according to claim 7, wherein the non-monocrystalline layer comprises an amorphous material comprising silicon.

9. The plasma processing method according to claim 1, wherein the applied DC voltage is from 100 V, to 300 V.

10. The plasma processing method according to claim 1, wherein the applied DC voltage is from −300 V to −100 V.

11. A plasma processing apparatus comprising:
    (a) a chamber connected to an evacuation means and a source gas-feeding means;
    (b) a second electrode provided in the chamber so as to oppose a substrate arranged in the chamber to be processed in the chamber, said substrate also serving as a first electrode;
    (c) a high frequency power source for applying a high frequency power within a frequency range from 20 MHz to 450 MHz between the substrate and the second electrode; and
    (d) a DC power source for applying a DC voltage from +100 V, to +300 V or from −300 V to −100 V, to the first electrode.

12. The plasma processing apparatus according to claim 11, wherein the first electrode is a substrate for an electrophotographic photosensitive member.

13. The plasma processing apparatus according to claim 11, wherein the first electrode is in a shape of a cylinder.

14. The plasma processing apparatus according to claim 11, wherein the first electrode is insulated from the second electrode.

15. A plasma processing method which comprises:
    (a) introducing a source gas into a chamber, said chamber connected to an evacuation means and a source gas-feeding means;
    (b) applying a high frequency power within a frequency range from 20 MHz to 450 MHz between (i) a first electrode provided in said chamber and (ii) a second electrode opposing the first electrode; and
    (c) applying an AC voltage of a lower frequency than the high frequency power to the first electrode, thereby decomposing said source gas and subjecting a surface of the first electrode to plasma processing.

16. The plasma processing method according to claim 15, wherein the AC voltage applied to the first electrode ranges from ±100 V, to ±300 V.

17. The plasma processing method according to claim 15, wherein the frequency of the AC voltage applied to the first electrode is not higher than 2 MHz.

18. The plasma processing method according to claim 15, wherein the discharge frequency is at least 31 MHz.

19. The plasma processing method according to claim 15, wherein the discharge frequency is at least 50 MHz.

20. The plasma processing method according to claim 15, wherein the first electrode is a substrate for an electrophotographic photosensitive member.

21. The plasma processing method according to claim 15, wherein the first electrode is in a shape of a cylinder.

22. The plasma processing method according to claim 15, wherein the plasma processing is conducted to form a deposition film.

23. The plasma processing method according to claim 15, wherein the plasma processing is conducted to form a non-monocrystalline layer.

24. The plasma processing method according to claim 23, wherein the non-monocrystalline layer comprises an amorphous material comprising silicon.

25. A plasma processing apparatus comprising:
    (a) a chamber connected to an evacuation means and a source gas-feeding means;
    (b) a second electrode provided in the chamber so as to oppose a substrate arranged in the chamber to be processed in the chamber, said substrate also serving as a first electrode;

(c) a high frequency power source for applying a high frequency power within a frequency range from 20 MHz to 450 MHz between the substrate and the second electrode; and (d) an AC power source for applying an AC voltage of a lower frequency than the high frequency power to the first electrode.

26. The plasma processing apparatus according to claim 25, wherein the AC power source generates a voltage within a range from ±100 V, to ±300 V.

27. The plasma processing apparatus according to claim 25, wherein the frequency generated by the AC power source is not higher than 2 MHz.

28. The plasma processing apparatus according to claim 25, further comprising a DC power source for applying a DC voltage to the first electrode.

29. The plasma processing apparatus according to claim 25, wherein the first electrode is in a shape of a cylinder.

30. The plasma processing apparatus according to claim 25, wherein the first electrode is insulated from the second electrode.

31. A plasma processing method which comprises:

(a) introducing a source gas into a chamber, said chamber connected to an evacuation means and a source gas-feeding means;

(b) applying a high frequency power within a frequency range from 20 MHz to 450 MHz between (i) a first electrode provided in said chamber and (ii) a second electrode opposing the first electrode; and (c) applying an AC voltage within a range from ±30 V t ±600 V to the first electrode, thereby decomposing said source gas and subjecting a surface of the first electrode to plasma processing.

32. The plasma processing method according to claim 31, wherein the AC voltage applied to the first electrode ranges from ±100 V, to ±300 V.

33. The plasma processing method according to claim 31, wherein the frequency of the AC voltage applied to the first electrode is not higher than 2 MHz.

34. The plasma processing method according to claim 31, wherein the discharge frequency is at least 31 MHz.

35. The plasma processing method according to claim 31, wherein the discharge frequency is at least 50 MHz.

36. The plasma processing method according to claim 31, wherein the first electrode is a substrate for an electrophotographic photosensitive member.

37. The plasma processing method according to claim 31, wherein the first electrode is in a shape of a cylinder.

38. The plasma processing method according to claim 31, wherein the plasma processing is conducted to form a deposition film.

39. The plasma processing method according to claim 31, wherein the plasma processing is conducted to form a non-monocrystalline layer.

40. The plasma processing method according to claim 39, wherein the non-monocrystalline layer comprises an amorphous material comprising silicon.

41. A plasma processing apparatus comprising:

(a) a chamber connected to an evacuation means and a source gas-feeding means;

(b) a second electrode provided in the chamber so as to oppose a substrate arranged in the chamber to be processed in the chamber, said substrate also serving as a first electrode to be processed and a second electrode opposing the first electrode provided in the chamber;

(c) a high frequency power source for applying a high frequency power within a frequency range from 20 MHz to 450 MHz between the substrate and the second electrode; and (d) an AC power source for applying an AC voltage within a range from ±30 V to ±600 V to the first electrode.

42. The plasma processing apparatus according to claim 41, wherein the AC power source generates a voltage within a range from ±100 V, to ±300 V.

43. The plasma processing apparatus according to claim 41, wherein the frequency generated by the AC power source is not higher than 2 MHz.

44. The plasma processing apparatus according to claim 41, further comprising a DC power source for applying a DC voltage to the first electrode.

45. The plasma processing apparatus according to claim 41, wherein the first electrode is in a shape of a cylinder.

46. The plasma processing apparatus according to claim 41, wherein the first electrode is insulated from the second electrode.

* * * * *

UNITED STATES PATENT AND TRADEMARK OFFICE
CERTIFICATE OF CORRECTION

PATENT NO. : 5,849,455

DATED : December 15, 1998

INVENTOR(S) : SHIGENORI UEDA ET AL.

It is certified that error appears in the above-identified patent and that said Letters Patent is hereby corrected as shown below:

Title page, item [57],

[57] ABSTRACT

Line 8, "make" should read --makes--.

COLUMN 2

Line 6, "have been" should read --are--.
   Line 7, "are" should read --have been--.

COLUMN 4

Line 35, "(1 )" should read --(1)--.

COLUMN 8

Line 23, "band" should read --brand--; and "poly(tetrafluoroethylene)" should read --poly(tetrafluoroethylene),--.

UNITED STATES PATENT AND TRADEMARK OFFICE
CERTIFICATE OF CORRECTION

PATENT NO. : 5,849,455

DATED : December 15, 1998

INVENTOR(S) : SHIGENORI UEDA ET AL.

It is certified that error appears in the above-identified patent and that said Letters Patent is hereby corrected as shown below:

COLUMN 9

```
Line 15, "on a" should read --on--.
Line 22, "thereby" should read --whereby--.
Line 23, "can be is" should read --can be--.
Line 37, "band" should read --brand--.
```

COLUMN 11

```
Line 13, "A cylindrical" should read --Cylindrical--.
```

COLUMN 12

```
Line 35, "an" should read --a--.
```

COLUMN 15

```
Line 53, "streak" should read --streaks--.
Line 55, "streak" should read --streaks--.
```

UNITED STATES PATENT AND TRADEMARK OFFICE
CERTIFICATE OF CORRECTION

PATENT NO. : 5,849,455

DATED : December 15, 1998

INVENTOR(S) : SHIGENORI UEDA ET AL.

It is certified that error appears in the above-identified patent and that said Letters Patent is hereby corrected as shown below:

COLUMN 16

Line 22, "phtosensitive" should read --photosensitive--.

COLUMN 22

Line 20, "member" should read --members--.
    Line 45, "kinds," should read --kind,--.

COLUMN 26

Table 11, "streak" (both occurrences) should read --streaks--.

COLUMN 27

Line 45, "100 V," should read --100 V--.

COLUMN 28

Line 2, "100 V," should read --100 V--.
    Line 16, "+100 V," should read --+ 100 V--.
    Line 40, "$\pm$100 V," should read --$\pm$100 V--.

UNITED STATES PATENT AND TRADEMARK OFFICE
CERTIFICATE OF CORRECTION

PATENT NO. : 5,849,455

DATED : December 15, 1998

INVENTOR(S) : SHIGENORI UEDA ET AL.

It is certified that error appears in the above-identified patent and that said Letters Patent is hereby corrected as shown below:

COLUMN 29

Line 12, "±100 V," should read --±100 V--.
    Line 33, "V t" should read --V to--.
    Line 39, "±100 V," should read --±100 V--.

COLUMN 30

Line 33, "±100 V," should read --±100 V--.

Signed and Sealed this

Sixteenth Day of November, 1999

Attest:

Q. TODD DICKINSON

*Attesting Officer*     *Acting Commissioner of Patents and Trademarks*